US 9,209,176 B2

(12) United States Patent
Wu et al.

(10) Patent No.: US 9,209,176 B2
(45) Date of Patent: Dec. 8, 2015

(54) SEMICONDUCTOR MODULES AND METHODS OF FORMING THE SAME

(71) Applicant: Transphorm Inc., Goleta, CA (US)

(72) Inventors: Yifeng Wu, Goleta, CA (US); Sung Hae Yea, La Canada, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 13/690,103

(22) Filed: Nov. 30, 2012

(65) Prior Publication Data

US 2013/0147540 A1   Jun. 13, 2013

Related U.S. Application Data

(60) Provisional application No. 61/568,022, filed on Dec. 7, 2011.

(51) Int. Cl.
    *H01L 27/088*    (2006.01)
    *H01L 21/58*    (2006.01)
    (Continued)

(52) U.S. Cl.
CPC ............ *H01L 27/0883* (2013.01); *H01L 21/58* (2013.01); *H01L 23/3735* (2013.01); *H01L 23/49811* (2013.01); *H01L 25/0655* (2013.01);
(Continued)

(58) Field of Classification Search
CPC .................. H01L 2225/06568; H01L 23/3735; H01L 25/0657; H01L 25/072; H01L 27/0629; H01L 27/0883; H03K 17/161; H03K 17/162
USPC .................. 257/723, 724, E25.016, 678, 691; 363/132, 141
See application file for complete search history.

(56) References Cited

U.S. PATENT DOCUMENTS

| 4,384,287 A | 5/1983 | Sakuma |
| 4,728,826 A | 3/1988 | Einzinger et al. |

(Continued)

FOREIGN PATENT DOCUMENTS

| CN | 101978589 | 2/2011 |
| CN | 102165694 | 8/2011 |

(Continued)

OTHER PUBLICATIONS

Authorized officer Kwak in Gu, International Search Report and Written Opinion in PCT/US2012/026810, mailed Jan. 23, 2013, 10 pages.

(Continued)

*Primary Examiner* — Marvin Payen
*Assistant Examiner* — Victor Barzykin
(74) *Attorney, Agent, or Firm* — Fish & Richardson P.C.

(57) ABSTRACT

Electronic modules, and methods of forming and operating modules, are described. The modules include a capacitor, a first switching device, and a second switching device. The electronic modules further include a substrate such as a DBC substrate, which includes an insulating layer between a first metal layer and a second metal layer, and may include multiple layers of DBC substrates stacked over one another. The first metal layer includes a first portion and a second portion isolated from one another by a trench formed through the first metal layer between the two portions. The first and second switching devices are over the first metal layer, a first terminal of the capacitor is electrically connected to the first portion of the first metal layer, and a second terminal of the capacitor is electrically connected to the second portion of the first metal layer, with the capacitor extending over the trench.

41 Claims, 21 Drawing Sheets

(51) Int. Cl.
*H03K 17/16* (2006.01)
*H01L 27/06* (2006.01)
*H01L 23/373* (2006.01)
*H01L 25/065* (2006.01)
*H01L 25/07* (2006.01)
*H01L 23/498* (2006.01)
*H01L 23/00* (2006.01)

(52) U.S. Cl.
CPC .......... *H01L 25/0657* (2013.01); *H01L 25/072* (2013.01); *H01L 27/0629* (2013.01); *H03K 17/161* (2013.01); *H03K 17/162* (2013.01); *H01L 24/29* (2013.01); *H01L 24/32* (2013.01); *H01L 24/48* (2013.01); *H01L 2224/291* (2013.01); *H01L 2224/293* (2013.01); *H01L 2224/2929* (2013.01); *H01L 2224/32145* (2013.01); *H01L 2224/48091* (2013.01); *H01L 2224/48105* (2013.01); *H01L 2224/48145* (2013.01); *H01L 2224/48249* (2013.01); *H01L 2224/73265* (2013.01); *H01L 2224/83801* (2013.01); *H01L 2224/83851* (2013.01); *H01L 2225/06568* (2013.01); *H01L 2924/13055* (2013.01); *H01L 2924/30107* (2013.01)

(56) References Cited

U.S. PATENT DOCUMENTS

| | | | |
|---|---|---|---|
| 4,808,853 A | 2/1989 | Taylor | |
| 4,864,479 A * | 9/1989 | Steigerwald et al. | 363/17 |
| 4,965,710 A * | 10/1990 | Pelly et al. | 363/56.03 |
| 5,198,964 A | 3/1993 | Ito et al. | |
| 5,291,065 A * | 3/1994 | Arai et al. | 257/723 |
| 5,379,209 A | 1/1995 | Goff | |
| 5,493,487 A | 2/1996 | Close et al. | |
| 5,637,922 A | 6/1997 | Fillion et al. | |
| 5,767,573 A * | 6/1998 | Noda et al. | 257/675 |
| 5,952,856 A | 9/1999 | Horiguchi et al. | |
| 6,008,684 A | 12/1999 | Ker et al. | |
| 6,107,844 A | 8/2000 | Berg et al. | |
| 6,130,831 A | 10/2000 | Matsunaga | |
| 6,172,550 B1 | 1/2001 | Gold et al. | |
| 6,333,617 B1 | 12/2001 | Itabashi et al. | |
| 6,395,593 B1 | 5/2002 | Pendharkar et al. | |
| 6,521,940 B1 | 2/2003 | Vu et al. | |
| 6,566,749 B1 | 5/2003 | Joshi et al. | |
| 6,650,169 B2 | 11/2003 | Faye et al. | |
| 6,770,964 B2 * | 8/2004 | Hiyoshi | 257/692 |
| 6,781,423 B1 | 8/2004 | Knoedgen | |
| 6,900,657 B2 | 5/2005 | Bui et al. | |
| 6,914,321 B2 * | 7/2005 | Shinohara | 257/678 |
| 7,116,567 B2 | 10/2006 | Shelton et al. | |
| 7,304,331 B2 | 12/2007 | Saito et al. | |
| 7,378,883 B1 | 5/2008 | Hsueh | |
| 7,420,224 B2 * | 9/2008 | Milich et al. | 257/177 |
| 7,443,648 B2 | 10/2008 | Cutter et al. | |
| 7,477,082 B2 | 1/2009 | Fukazawa | |
| 7,501,669 B2 | 3/2009 | Parikh et al. | |
| 7,548,112 B2 | 6/2009 | Sheppard | |
| 7,557,434 B2 * | 7/2009 | Malhan et al. | 257/678 |
| 7,612,602 B2 | 11/2009 | Yang et al. | |
| 7,639,064 B2 | 12/2009 | Hsiao et al. | |
| 7,719,055 B1 | 5/2010 | McNutt et al. | |
| 7,746,020 B2 | 6/2010 | Schnetzka et al. | |
| 7,804,328 B2 | 9/2010 | Pentakota et al. | |
| 7,851,825 B2 | 12/2010 | Suh et al. | |
| 7,875,907 B2 | 1/2011 | Honea et al. | |
| 7,875,914 B2 | 1/2011 | Sheppard | |
| 7,915,643 B2 | 3/2011 | Suh et al. | |
| 7,920,013 B2 | 4/2011 | Sachdev et al. | |
| 7,965,126 B2 | 6/2011 | Honea et al. | |
| 8,013,580 B2 | 9/2011 | Cervera et al. | |
| 8,018,056 B2 * | 9/2011 | Hauenstein | 257/730 |
| 8,441,128 B2 * | 5/2013 | Domes | 257/758 |
| 8,604,611 B2 * | 12/2013 | Hauenstein | 257/724 |
| 2002/0125920 A1 | 9/2002 | Stanley | |
| 2002/0163070 A1 | 11/2002 | Choi | |
| 2003/0178654 A1 | 9/2003 | Thornton | |
| 2004/0178831 A1 | 9/2004 | Li et al. | |
| 2005/0052221 A1 | 3/2005 | Kohnotoh et al. | |
| 2005/0067716 A1 | 3/2005 | Mishra et al. | |
| 2005/0077947 A1 | 4/2005 | Munzer et al. | |
| 2005/0146310 A1 | 7/2005 | Orr | |
| 2005/0189561 A1 | 9/2005 | Kinzer et al. | |
| 2005/0189562 A1 | 9/2005 | Kinzer et al. | |
| 2005/0218964 A1 | 10/2005 | Oswald et al. | |
| 2006/0033122 A1 | 2/2006 | Pavier et al. | |
| 2006/0043499 A1 | 3/2006 | De Cremoux et al. | |
| 2006/0060871 A1 | 3/2006 | Beach | |
| 2006/0102929 A1 | 5/2006 | Okamoto et al. | |
| 2006/0163648 A1 | 7/2006 | Hauenstein et al. | |
| 2006/0176007 A1 | 8/2006 | Best | |
| 2006/0237825 A1 | 10/2006 | Pavier et al. | |
| 2006/0238234 A1 | 10/2006 | Benelbar et al. | |
| 2006/0261473 A1 | 11/2006 | Connah et al. | |
| 2007/0018210 A1 | 1/2007 | Sheppard | |
| 2007/0080672 A1 | 4/2007 | Yang | |
| 2007/0090373 A1 | 4/2007 | Beach et al. | |
| 2007/0138651 A1 * | 6/2007 | Hauenstein | 257/782 |
| 2007/0146045 A1 | 6/2007 | Koyama | |
| 2007/0278518 A1 | 12/2007 | Chen et al. | |
| 2008/0017998 A1 | 1/2008 | Pavio | |
| 2008/0018366 A1 | 1/2008 | Hanna | |
| 2008/0122418 A1 | 5/2008 | Briere et al. | |
| 2008/0136390 A1 | 6/2008 | Briere | |
| 2008/0158110 A1 | 7/2008 | Iida et al. | |
| 2008/0191342 A1 | 8/2008 | Otremba | |
| 2008/0203559 A1 | 8/2008 | Lee et al. | |
| 2008/0248634 A1 | 10/2008 | Beach | |
| 2008/0272404 A1 | 11/2008 | Kapoor | |
| 2008/0283844 A1 | 11/2008 | Hoshi et al. | |
| 2009/0065810 A1 * | 3/2009 | Honea et al. | 257/192 |
| 2009/0072269 A1 | 3/2009 | Suh et al. | |
| 2009/0167411 A1 | 7/2009 | Machida et al. | |
| 2009/0180304 A1 | 7/2009 | Bahramian et al. | |
| 2009/0201072 A1 * | 8/2009 | Honea et al. | 327/424 |
| 2009/0215230 A1 | 8/2009 | Muto et al. | |
| 2009/0236728 A1 | 9/2009 | Satou et al. | |
| 2009/0278513 A1 | 11/2009 | Bahramian et al. | |
| 2009/0315594 A1 | 12/2009 | Pentakota et al. | |
| 2010/0067275 A1 | 3/2010 | Wang et al. | |
| 2010/0073067 A1 | 3/2010 | Honea | |
| 2010/0097119 A1 | 4/2010 | Ma et al. | |
| 2010/0117095 A1 | 5/2010 | Zhang | |
| 2010/0201439 A1 * | 8/2010 | Wu et al. | 327/581 |
| 2011/0019450 A1 | 1/2011 | Callanan et al. | |
| 2011/0025397 A1 * | 2/2011 | Wang et al. | 327/333 |
| 2011/0121314 A1 | 5/2011 | Suh et al. | |
| 2011/0169549 A1 | 7/2011 | Wu | |
| 2011/0241170 A1 * | 10/2011 | Haeberlen et al. | 257/532 |
| 2011/0249477 A1 | 10/2011 | Honea et al. | |
| 2013/0043593 A1 * | 2/2013 | Domes | 257/758 |
| 2013/0140684 A1 * | 6/2013 | Hauenstein | 257/659 |

FOREIGN PATENT DOCUMENTS

| | | |
|---|---|---|
| CN | 102308387 | 1/2012 |
| EP | 0 427 143 | 5/1991 |
| EP | 2 188 842 | 5/2010 |
| EP | 2 243 213 | 10/2010 |
| JP | 5-075040 | 3/1993 |
| JP | 6-067744 | 3/1994 |
| JP | 2000-101356 | 4/2000 |
| JP | 2000-124358 | 4/2000 |
| JP | 2003-244943 | 8/2003 |
| JP | 2003-338742 | 11/2003 |
| JP | 2004-281454 | 10/2004 |
| JP | 2006-033723 | 2/2006 |
| JP | 2006-173754 | 6/2006 |
| JP | 2007-036218 | 2/2007 |
| JP | 2007-215331 | 8/2007 |
| JP | 2007-294769 | 11/2007 |
| JP | 2008-199771 | 8/2008 |

(56) References Cited

FOREIGN PATENT DOCUMENTS

| | | |
|---|---|---|
| JP | 2010-539712 | 12/2010 |
| JP | 2011-018740 | 1/2011 |
| JP | 2011-512119 | 4/2011 |
| JP | 2012-517699 | 8/2012 |
| TW | 200941920 | 10/2009 |
| TW | 201027912 | 7/2010 |
| TW | 201036155 | 10/2010 |
| TW | 201126686 | 8/2011 |
| TW | 201143017 | 12/2011 |
| WO | WO 2009/036181 | 3/2009 |
| WO | WO 2009/102732 | 8/2009 |
| WO | WO 2010/039463 | 4/2010 |
| WO | WO 2010/090885 | 8/2010 |
| WO | WO 2011/053981 | 5/2011 |
| WO | WO 2011/085260 | 7/2011 |
| WO | WO 2011/097302 | 8/2011 |

OTHER PUBLICATIONS

Napierala et al. (2006), "Selective GaN Epitaxy on Si(111) Substrates Using Porous Aluminum Oxide Buffer Layers," Journal of the Electrochemical Society, 153(2):G125-G127, 4 pages.

Search Report and Action in TW Application No. 098132132, issued Dec. 6, 2012, 8 pages.

Authorized officer Sang Won Choi, International Search Report and Written Opinion in PCT/US2012/067569, mailed Jun. 25, 2013, 12 pages.

Authorized officer Keon Hyeong Kim, International Search Report and Written Opinion in PCT/US2008/076160 mailed Mar. 18, 2009, 11 pp.

Authorized officer Simin Baharlou, International Preliminary Report on Patentability in PCT/US2008/076160, mailed Mar. 25, 2010, 6 pp.

Authorized officer Jae Woo Wee, International Search Report and Written Opinion in PCT/US2009/033699, mailed Sep. 21, 2009, 11 pp.

Authorized officer Dorothée Mülhausen, International Preliminary Report on Patentability in PCT/US2009/033699, mailed Aug. 26, 2010, 6 pp.

Authorized officer Sung Hee Kim, International Search Report and the Written Opinion in PCT/US2009/057554, mailed May 10, 2010, 13 pp.

Authorized Officer Gijsbertus Beijer, International Preliminary Report on Patentability in PCT/US2009/057554, mailed Mar. 29, 2011, 7 pp.

Authorized officer Sung Chan Chung, International Search Report and Written Opinion for PCT/US2010/021824, mailed Aug. 23, 2010, 9 pp.

Authorized officer Beate Giffo-Schmitt, International Preliminary Report on Patentability in PCT/US2010/021824, mailed Aug. 23, 2010, 6 pp.

Authorized officer Bon Gyoung Goo, International Search Report and Written Opinion in PCT/US2010/055129, mailed Jul. 1, 2011, 11 pp.

Authorized officer Yolaine Cussac, International Preliminary Report on Patentability in PCT/US2010/055129, mailed May 18, 2012, 6 pp.

Authorized officer Kee Young Park, International Search Report and Written Opinion in PCT/US2011/023485, mailed Sep. 23, 2011, 10 pp.

Authorized officer Nora Lindner, International Preliminary Report on Patentability in PCT/US2011/023485, mailed Aug. 16, 2012, 7 pages.

Authorized officer Sung Joon Lee, International Search Report and Written Opinion in PCT/US2011/020592, mailed Sep. 19, 2011, 9 pages.

Authorized officer Philippe Bécamel, International Preliminary Report on Patentability in PCT/US2011/020592, mailed Jul. 19, 2012, 7 pages.

Chen, et al., "Single-Chip Boost Converter Using Monolithically Integrated AlGan/GaN Lateral Field-Effect Rectifier and Normally Off HEMT," IEEE Electron Device Letters, May 2009, 30(5):430-432.

Wu et al., "A 97.8% Efficient GaN HEMT Boost Converter with 300-W Output Power at 1MHz," Aug. 2008, Electronic Device Letters, IEEE, 29(8):824-826.

Authorized officer Simin Baharlou, International Preliminary Report on Patentability in PCT/US2012/067569, mailed Jun. 19, 2014, 7 pages.

European Search Report in Application No. EP 12 855 693.3, mailed Aug. 14, 2015, 3 pages.

Communication pursuant to Article 94(3) EPC in Application No. EP 12 855 693.3, mailed Aug. 26, 2015, 5 pages.

\* cited by examiner

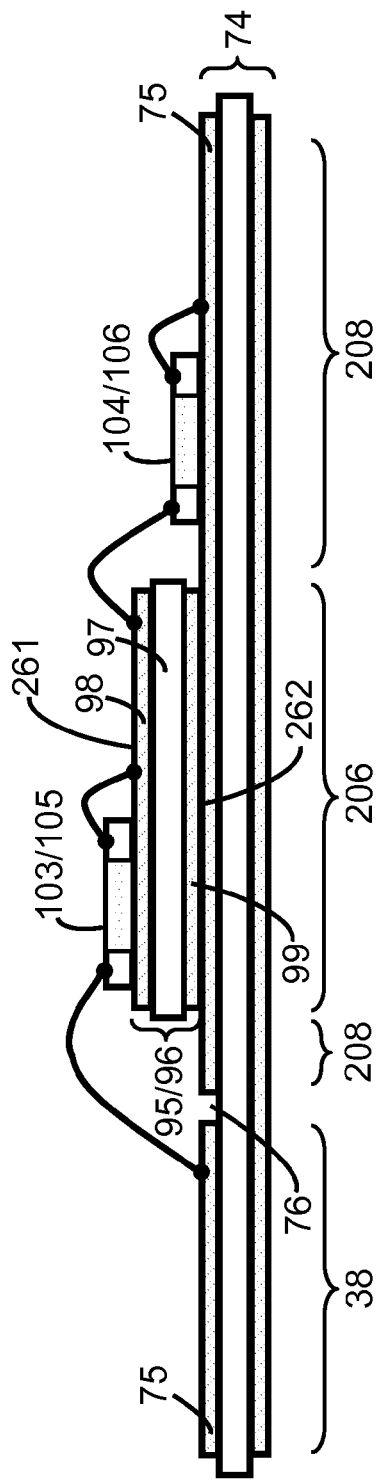
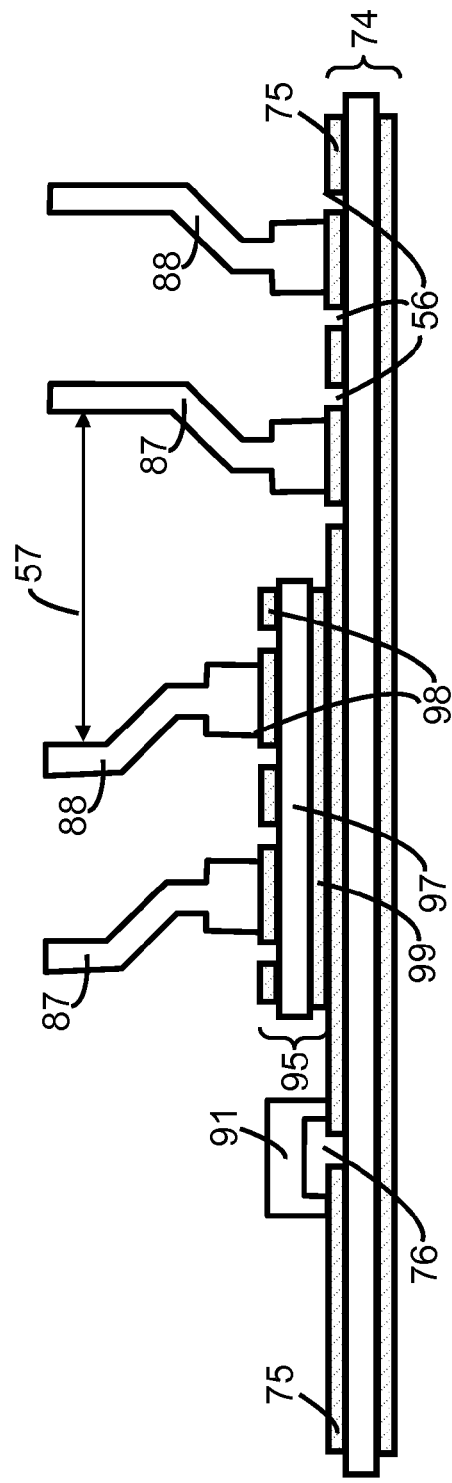
Figure 8A
Figure 8B

SEMICONDUCTOR MODULES AND METHODS OF FORMING THE SAME

CROSS-REFERENCE TO RELATED APPLICATION

This application claims priority to U.S. Provisional Application No. 61/568,022, filed on Dec. 7, 2011. The disclosure of the prior application is considered part of and is incorporated by reference in the disclosure of this application.

TECHNICAL FIELD

This invention relates to configurations for electronic modules formed of semiconductor electronic devices.

BACKGROUND

Power switching circuits such as bridge circuits are commonly used in a variety of applications. A circuit schematic of a prior art 3-phase bridge circuit 10 configured to drive a motor is shown in FIG. 1. Each of the three half bridges 15, 25, and 35 in circuit 10 includes two transistors (41-46), which are able to block voltage in a first direction and are capable of conducting current in the first direction or optionally in both directions. In applications where the transistors employed in the bridge circuit 10 are only capable of conducting current in one direction, for example when silicon IGBTs are used, an anti-parallel diode (not shown) may be connected to each of the transistors 41-46. The transistors 41-46 are each capable of blocking a voltage at least as large as the high voltage (HV) source 11 of the circuit 10 when they are biased in the OFF state. That is, when the gate-source voltage $V_{GS}$ of any of transistors 41-46 is less than the transistor threshold voltage $V_{th}$, no substantial current flows through the transistor when the drain-source voltage $V_{DS}$ (i.e., the voltage at the drain relative to the source) is between 0V and HV. When biased in the ON state (i.e. with $V_{GS}$ greater than the transistor threshold voltage), the transistors 41-46 are each capable of conducting sufficiently high current for the application in which they are used. The transistors 41-46 may be enhancement mode or E-mode transistors (normally off, $V_{th}>0$), or depletion mode or D-mode (normally on, $V_{th}<0$) transistors. In power circuits, enhancement mode devices are typically used to prevent accidental turn on in which may cause damage to the devices or other circuit components. Nodes 17, 18, and 19 are all coupled to one another via inductive loads, i.e., inductive components such as motor coils (not shown in FIG. 1).

FIG. 2a shows a prior art half bridge 15 of the full 3-phase motor drive in FIG. 1, along with the winding of the motor (inductive component 21) between nodes 17 and 18 and the transistor 44, into which the motor current feeds. For this phase of power, transistor 44 is continuously on ($V_{gs44}>V_{th}$) and transistor 42 is continuously off ($V_{gs42}<V_{th}$, i.e., $V_{gs42}=0V$ if enhancement mode transistors are used), while transistor 41 is modulated with a pulse width modulation (PWM) signal to achieve the desired motor current. FIG. 2b indicates the path of the current 27 during the time that transistor 41 is biased on. For this bias, the motor current flows through transistors 41 and 44, while no current flows through transistor 42 because transistor 42 is biased off, and the voltage at node 17 is close to HV, so transistor 42 blocks a voltage which is close to HV.

As used herein, the term "blocking a voltage" refers to a transistor, device, or component being in a state for which substantial current, such as current that is greater than 0.001 times the average operating current during regular on-state conduction, is prevented from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the average operating current during regular on-state conduction.

Referring to FIG. 2c, when transistor 41 is switched off, no current can flow through transistor 41, and so the motor current flows in the reverse direction through transistor 42, which can occur whether transistor 42 is biased on or off. Alternatively, an anti-parallel freewheeling diode (not shown) can be connected across transistor 42, in which case the reverse current flows through the freewheeling diode. During such operation, the inductive component 21 forces the voltage at node 17 to a sufficiently negative value to cause reverse conduction through transistor 42, and transistor 41 blocks a voltage which is close to HV.

In many high voltage circuit applications, the circuit components are mounted on a substrate which includes a ceramic or other electrically insulating, high thermal conductivity material, such as AlN or $Al_2O_3$. The electrically insulating, high thermal conductivity material is coated on at least one side (typically both sides) with a high heat capacity metal, such as copper, thereby allowing for heat generated by the circuit components to be dissipated. In particular, direct bonded copper (DBC) substrates, which are formed by direct bonding of pure copper in a high temperature melting and diffusion process to a ceramic isolator such as AlN or $Al_2O_3$, are suitable substrates. An exemplary DBC prior art substrate, which includes copper layers 61 and 62 bonded to opposite sides of ceramic layer 60, is illustrated in FIG. 3. DBC substrates are currently only available as single layer substrates, unlike lower thermal conductivity printed circuit board (PCB) substrates, which can be formed with multiple insulating layers stacked on top of each other with a conductive metal layer between each successive insulating layer. The process used to form DBC substrates, which ensures sufficiently high thermal conductivity for high voltage applications, can currently only be used to form DBC substrates that include a single insulating/ceramic layer with pure copper layers directly bonded to each side. Hence, layouts that incorporate DBC substrates have been limited to single layers of metal-ceramic-metal DBC material. While PCB substrates can be formed with multiple insulating layers each separated by a metal layer, which allows for more flexibility in circuit layout, the thermal conductivity and/or heat capacity of such substrates, which are lower than those of DBC substrates, are not sufficiently high for many high voltage circuits, for example bridge circuits used for power conversion.

Referring back to FIGS. 2a-2c, the mode of switching illustrated in prior art FIGS. 2a-2c is commonly known as hard-switching. A hard-switching circuit configuration is one in which the switching transistors are configured to have high currents passing through them as soon as they are switched ON, and to have high voltages across them as soon as they are switched OFF. More specifically, a hard-switching circuit configuration is one in which the switching transistors are configured to be switched from OFF to ON while the transistors are sustaining a large drain-source voltage, and to have high currents passing through them as soon as they are turned ON. Transistors switched under these conditions are said to be "hard-switched". Hard-switched circuits tend to be relatively simple and to be operable at a wide range of output load powers. However, hard-switched circuits are typically prone to large voltage overshoots and hence high levels of EMI. Alternative circuit configurations make use of additional passive and/or active components, or alternatively signal timing techniques, to allow the transistors to be "soft-switched". A soft-switching circuit configuration is one in which the switching transistors are configured to be switched ON during zero-current (or near zero-current) conditions or during zero-voltage (or near zero-voltage) conditions. Soft-switching methods and configurations have been developed to reduce switching losses and to address the high levels of electro-magnetic interference (EMI) and associated ringing observed in hard-switched circuits, especially in high current and/or high voltage applications. While soft-switching can in many cases alleviate these problems, the circuitry required for soft switching typically includes many additional components, resulting in increased overall cost and complexity. Soft-switching also typically requires that the circuits be configured to switch only at specific times when the zero-current or zero-voltage conditions are met, hence limiting the control signals that can be applied and in many cases reducing circuit performance. Furthermore, due to the required resonance conditions for soft-switching operation, the output load for each soft-switched circuit must be within a given range of values, thereby limiting the operation range of the circuit. Hence, alternative configurations and methods are desirable for hard-switched power switching circuits in order to prevent excessively high voltage overshoots and to maintain sufficiently low levels of EMI while allowing for a wide range of output loads.

SUMMARY

In a first aspect of the invention, an electronic module is described. The electronic module includes a capacitor, a first switching device (105/105') comprising a first transistor (41/109), and a second switching device (106/106') comprising a second transistor (42/108). The electronic module further includes a substrate (74) comprising an insulating layer (60) between a first metal layer (61/75) and a second metal layer (62), the first metal layer including a first portion (37) and a second portion (38), the second portion being electrically isolated from the first portion by a trench (76) formed through the first metal layer between the first portion and the second portion. The first and second switching devices are over the first metal layer, a first terminal of the capacitor is electrically connected to the first portion of the first metal layer, and a second terminal of the capacitor is electrically connected to the second portion of the first metal layer, with the capacitor extending over the trench.

In a second aspect of the invention, an electronic module is described. The electronic module includes a first substrate (74) comprising a first metal layer (61/75) on a first insulating layer (60), the first metal layer including a first portion (206) and a second portion (208), and a second substrate (96/96') comprising a second insulating layer (60/97) between a second metal layer (99/62) and a third metal layer (98/61), the second substrate having a second surface (262) and a third surface (261) on an opposite side of the second substrate from the second surface, the second insulating layer having a smaller area than the first insulating layer. The electronic module further includes a first semiconductor device (105/105'). The second substrate is mounted over the first portion of the first metal layer without being over the second portion of the first metal layer, with the second surface of the second substrate directly contacting the first metal layer, and the first semiconductor device is mounted on the third surface of the second substrate.

In a third aspect of the invention, an electronic module is described. The electronic module includes a first substrate (74) comprising a first insulating layer (60) between a first metal layer (62) and a second metal layer (61/75), and a second substrate (96/96') comprising a second insulating layer (60/97) between a third metal layer (99/62) and a fourth metal layer (98/61). The second substrate has a smaller area than the first substrate, and the second substrate is mounted on a first portion (206) of the first substrate with the third metal adjacent to or contacting the second metal. The electronic module further includes a first switching device (106/106') having a first gate and a first source, and a second switching device (105/105') having a second gate and a second source. The first switching device is mounted on the second metal layer of the first substrate and the second substrate is between the second switching device and the first substrate.

Electronic modules described herein can includes one or more of the following features. A drain of the first transistor (41/109) can be electrically connected to a source of the second transistor (42/108), and the first and second transistors can both be over the first portion of the first metal layer. The first portion of the first metal layer can include means to electrically connect the first portion of the first metal layer to a DC ground or to a first DC voltage, and the second portion of the first metal layer can include means to electrically connect the second portion of the first metal layer to a second DC voltage. The capacitor can be configured to stabilize a voltage difference between the first and the second portions of the first metal layer. The first or second transistor can be a III-Nitride transistor. The substrate can include a direct bonded copper substrate. The electronic module can further include a second substrate comprising a second insulating layer between a third metal layer and a fourth metal layer, the second substrate being over a third portion of the first metal layer but not being over the first and second portions of the first metal layer, wherein the second substrate is between the second transistor and the first substrate, and the first transistor is over the first or second portion of the first metal layer.

The first substrate and the second substrate can include direct bonded copper substrates. The electronic module can further include a second semiconductor device (104/106) mounted on the second portion of the first metal layer. The first semiconductor device (103/105) can comprise a first transistor (41/109), the second semiconductor device (104/106) can comprise a second transistor (42/108), and a source of the first transistor and a drain of the second transistor can be electrically connected to the third metal layer. The first transistor or the second transistor can be a III-Nitride transistor. The first metal layer can further include a third portion (38), wherein the third portion is electrically isolated from the second portion (208) by a trench formed through the first metal layer between the third portion and the second portion. The electronic module can further comprise a capacitor, wherein a first terminal of the capacitor is electrically connected to the third portion of the first metal layer, a second terminal of the capacitor is electrically connected to the second portion of the first metal layer, and the capacitor extends over the trench. A drain of the first transistor (41) can be electrically connected to the third portion (38) of the first metal layer. The first semiconductor device can further comprise a third transistor (108), a source of the third transistor can be electrically connected to a drain of the first transistor (109), and a drain of the first transistor can be electrically connected to the third portion (38) of the first metal layer.

The electronic module can further comprise a third substrate (126) comprising a third insulating layer (60) between a fourth metal layer (62) and a fifth metal layer (61), the third insulating layer having a smaller area than the second insulating layer, with the third substrate mounted directly over the third surface of the second substrate. The first semiconductor device can include a first transistor, the second semiconductor device can include a second transistor, and a source of the first transistor and a drain of the second transistor can both be electrically connected to the third metal layer. The first metal layer can further include a third portion, with the third portion being electrically isolated from the second portion by a trench formed through the first metal layer between the third portion and the second portion. The electronic module can further comprise a capacitor, with a first terminal of the capacitor electrically connected to the third portion of the first metal layer, a second terminal of the capacitor electrically connected to the second portion of the first metal layer, and the capacitor extending over the trench. A drain of the first transistor can be electrically connected to the third portion of the first metal layer. The first semiconductor device can further comprise a third transistor, with a source of the third transistor electrically connected to a drain of the first transistor, and a drain of the first transistor electrically connected to the third portion of the first metal layer.

The first and second semiconductor devices can comprise transistors, the transistors being part of a half bridge. The first source can be electrically connected to a first source lead, the first gate can be electrically connected to a first gate lead, the second source can be electrically connected to a second source lead, and the second gate can be electrically connected to a second gate lead. The first source lead and first gate lead can be mounted on the second metal layer of the first substrate, and the second source lead and second gate leads can be mounted on the fourth metal layer of the second substrate. The first source lead can extend away from a surface of the first substrate, the second gate lead can extend away from a surface of the second substrate, the first source lead can include a bend in a direction away from the second switching device, and the second gate lead can include a bend in a direction away from the first switching device.

In a fourth aspect of the invention, a method of manufacturing an electronic module is described. The method includes providing a first substrate comprising a first metal layer on a first insulating layer, the first substrate having a first surface, with the first substrate including a first portion and a second portion. The method further includes providing a second substrate comprising a second insulating layer between a second metal layer and a third metal layer, the second substrate having a second surface and a third surface on an opposite side of the second substrate from the second surface. The method also includes mounting the second substrate over the first surface in the first portion of the first substrate with the second surface between the third surface and the first surface; and mounting a first semiconductor device on the third surface of the second substrate.

Methods of manufacturing electronic modules described herein can include one or more of the following features. The method can further comprise mounting a second semiconductor device on the first surface of the first substrate in the second portion of the first substrate. The first semiconductor device or the second semiconductor device can be a transistor. The transistor can comprise source, gate, and drain electrodes, each of the electrodes being on a first side of the transistor. The transistor can be a III-Nitride transistor. The first semiconductor device or the second semiconductor device can be a switching transistor which is configured to be hard-switched. A switching time of the switching transistor can be about 3 nanoseconds or less. Mounting the first semiconductor device on the second substrate or mounting the second semiconductor device on the first substrate can be performed prior to mounting the second substrate over the first surface in the first portion of the first substrate. The second surface of the second substrate can be attached directly to the first surface of the first substrate in the first portion of the first substrate. The first surface of the first substrate can comprise a surface of the first metal layer, the second surface of the second substrate can comprise a surface of the second metal layer, and the third surface of the second substrate can comprise a surface of the third metal layer.

The method can further comprise partially removing the first metal layer. Partially removing the first metal layer can comprise forming an isolation trench through the first metal layer. Partially removing of the first metal layer can be performed prior to mounting the second substrate over the first surface in the first portion of the first substrate. Mounting the second substrate over the first portion of the first substrate can comprise soldering the second surface of the second substrate to the first portion of the first surface of the first substrate. The first insulator layer or the second insulator layer can comprise a ceramic material. One or more of the first, second, or third metal layers can comprise copper. The first substrate or the second substrate can be a direct bonded copper (DBC) substrate.

An area of the first surface of the first substrate can be larger than an area of the second surface of the second substrate. The electronic module can comprise a half bridge. The electronic module can comprise a power inverter or a power converter. The method can further comprise mounting a capacitor having a first terminal and a second terminal on the electronic module. The method can further comprise forming a trench through the first metal layer in the second portion of the first substrate. Mounting the capacitor on the electronic module can comprise connecting the first terminal to the first metal layer on a first side of the trench and connecting the second terminal to the first metal layer on a second side of the trench. The first substrate can further comprise a fourth metal layer on an opposite side of the first insulating layer from the first metal layer.

In a fifths aspect of the invention, an electronic device is described. The electronic device includes an enhancement-mode transistor comprising a first source electrode, a first gate electrode, a first drain electrode, and a first semiconductor layer. The first source and first gate electrodes are on an opposite side of the first semiconductor layer from the first gate electrode. The electronic device further includes a depletion-mode transistor comprising a second source electrode and a second gate electrode, the second source electrode being over a second semiconductor layer. The enhancement-mode transistor is mounted directly on top of or over the second source electrode, with the first drain electrode in direct electrical contact with the second source electrode.

Electronic devices and components described herein can include one or more of the following features. The depletion-mode transistor can further comprise a second drain electrode, and the second source and drain electrodes can both be on a first side of the second semiconductor layer. The depletion-mode transistor can be a lateral device. The enhancement-mode transistor can be a silicon-based transistor. The depletion-mode transistor can be a III-Nitride transistor. The first source electrode can be electrically connected to the second gate electrode. The depletion-mode transistor can comprise an insulator layer on the semiconductor layer, with the second source electrode on the insulator layer. The depletion-mode transistor can comprise a device active area and a non-active area, wherein a device channel is in the semiconductor layer in the device active area but not in the semiconductor layer in the non-active area, and the insulator layer is over both the device active area and the non-active area. The enhancement-mode transistor can be on the insulating layer and be directly over a portion of the device active area and a portion of the non-active area. The depletion-mode transistor can have a higher breakdown voltage than the enhancement-mode transistor.

In a sixth aspect of the invention, a method of forming an electronic device is described. The method includes providing an enhancement-mode transistor comprising a first source electrode, a first gate electrode, a first drain electrode, and a first semiconductor layer, wherein the first source and first gate electrodes are on an opposite side of the first semiconductor layer from the first gate electrode. The method also includes providing a depletion-mode transistor comprising a second source electrode and a second gate electrode, the second source electrode being over a second semiconductor layer. The method further includes mounting the enhancement-mode transistor directly on top of or over the second source electrode, with the first drain electrode in direct electrical contact with the second source electrode.

Methods of forming electronic devices and modules described herein can include one or more of the following features. The depletion-mode transistor can be a lateral device. The method can further comprise wire bonding the second gate electrode to the first source electrode.

In a seventh aspect of the invention, a method of operating a power inverter is described. The method includes connecting the power inverter to a high voltage supply, the high voltage supply providing a voltage of at least 500V, and switching the switching device from an on state to an off state or from an off state to an on state. In the on state the switching device conducts between 40 and 50 Amps, in the off state the switching device blocks the voltage provided by high voltage supply, a switching time of the switching is less than 10 nanoseconds, and the voltage across the switching device never exceeds 1.35 times the voltage provided by the high voltage supply.

Methods of operating a power inverter described herein can include one or more of the following features. The switching time can be less than 5 nanoseconds. The voltage across the switching device never exceeds 700V.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

FIGS. 8A and 8B are cross-sectional views along portions of the electronic module of FIG. 7.

Like reference symbols in the various drawings indicate like elements.

DETAILED DESCRIPTION

Figure 1:
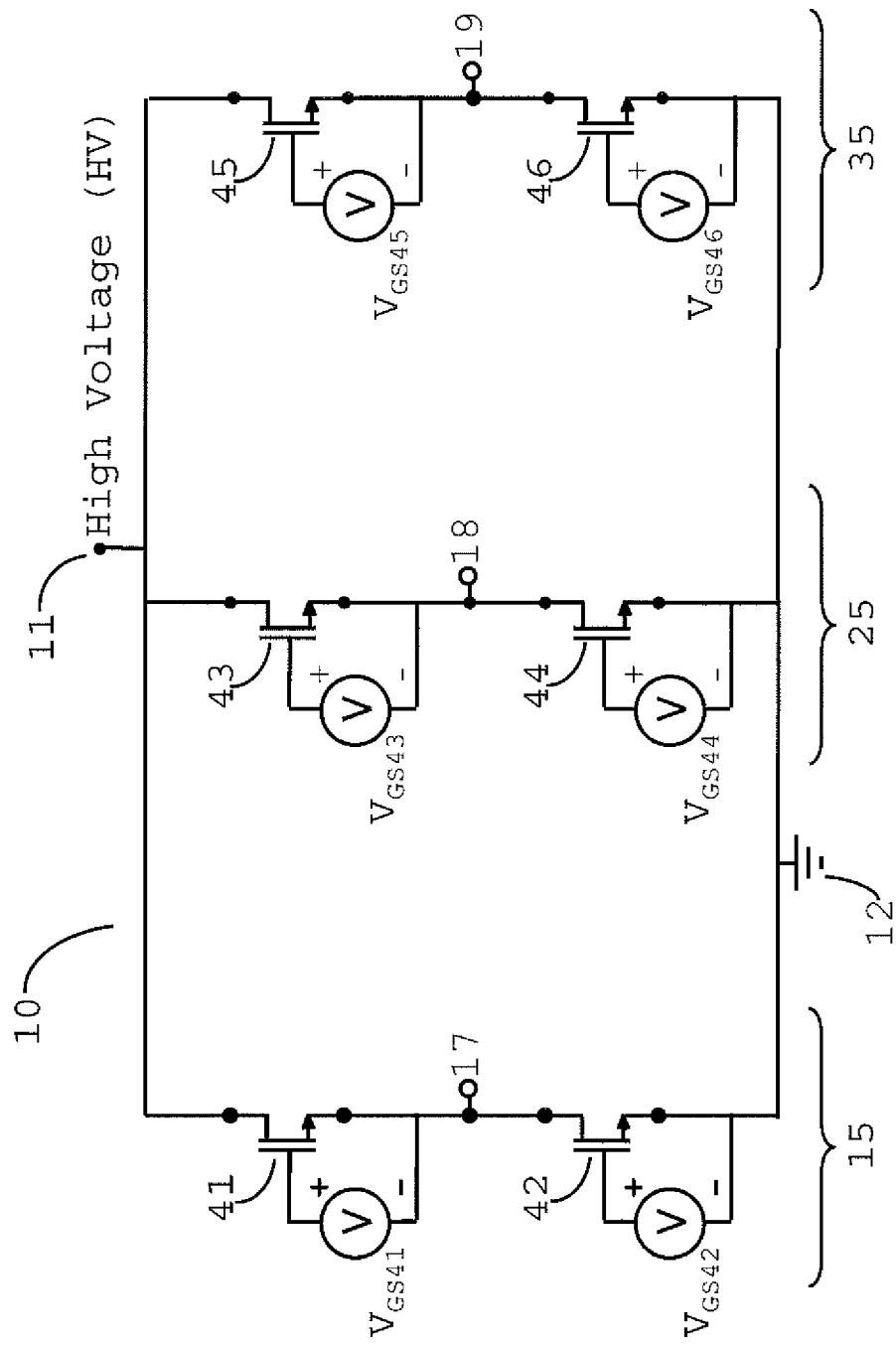
FIG. 1 illustrates a prior art circuit schematic of a 3-phase bridge circuit.

Described herein are electronic components and methods suitable for maintaining low levels of EMI in electronic power switching circuits, thereby allowing for higher circuit stability and improved performance. The electronic components can also have a reduced size as compared to conventional components, thereby allowing for lower production costs.

The transistors or other switching devices in the circuits described herein are typically configured to be hard-switched, as previously described, at very high switching rates (i.e., with very small switching times). When a transistor of one of the circuits herein is in the off state with no substantial current flowing through it, it typically blocks a voltage between its drain and source terminals which is close to the circuit high voltage. When a transistor of one of the circuits herein is in the on state, it typically has substantial drain-source current passing through with only a small voltage across the device. The switching time of a switching transistor switched under hard-switching conditions is defined as follows. When the transistor is switched from the off state described above to the on state described above, the current through the device begins to increase at the onset of switching, the rate of increase being adjustable by adjusting the conditions of the control circuitry, while the voltage across the device remains approximately the same. The drain-source voltage across the device does not drop substantially until the point at which substantially all the load current is passing through the transistor. The time that elapses between the onset of switching and the drop in voltage across the device is referred to as the "switching time" for turning the transistor on. More specifically, the "switching time" for turning the transistor on can be defined as the time that elapses between the point at which the drain-source voltage equals 90% of the blocking voltage and the point at which the drain-source voltage equals 10% of the blocking voltage. The total voltage switched across the device divided by the switching time (dV/dt) is referred to as the "voltage switching rate" or just the "switching rate".

In the case of switching the transistor from the on state to the off state, the voltage across the device increases to the off state voltage approximately at the onset of switching, while the decrease in current from the on state value to the off state value takes a longer time, the rate of decrease again being adjustable by adjusting the conditions of the control circuitry. The time that elapses between the onset of switching and the drop to zero current through the device is referred to as the "switching time" for turning the transistor off. More specifically, the "switching time" for turning the transistor off can be defined as the time that elapses between the point at which the drain-source voltage equals 10% of the blocking voltage and the point at which the drain-source voltage equals 90% of the blocking voltage. The total current switched through the device divided by the switching time (dI/dt) is referred to as the "current switching rate" or just the "switching rate". In general, while shorter switching times (and therefore higher switching rates) typically result in lower switching losses, they typically also cause higher levels of EMI, which can degrade circuit components or damage them such that they are rendered inoperable.

Figure 2A:
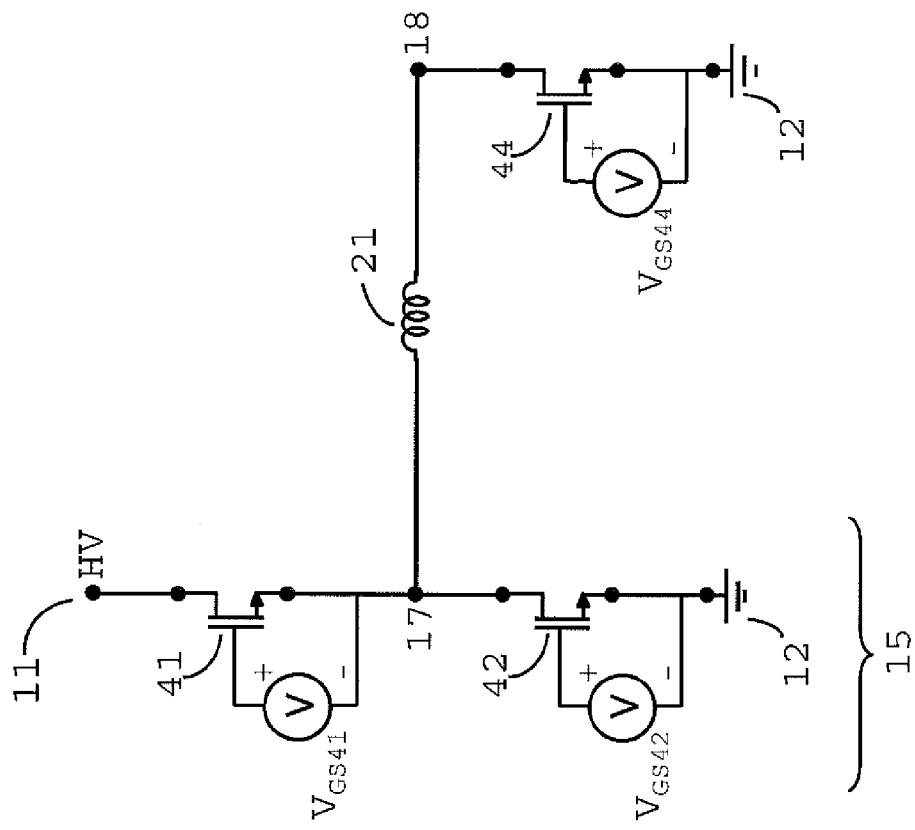
FIGS. 2a-c illustrate portions of the prior art 3-phase bridge circuit of FIG. 1 under various operating conditions.
Figure 2B:
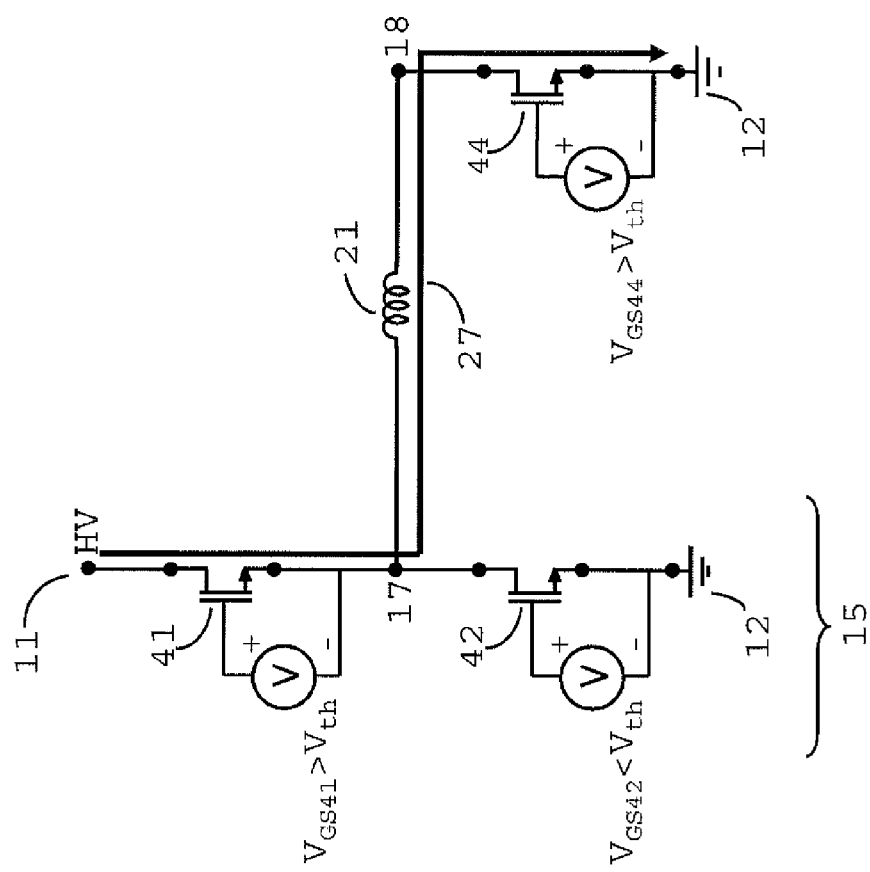
Figure 2C:
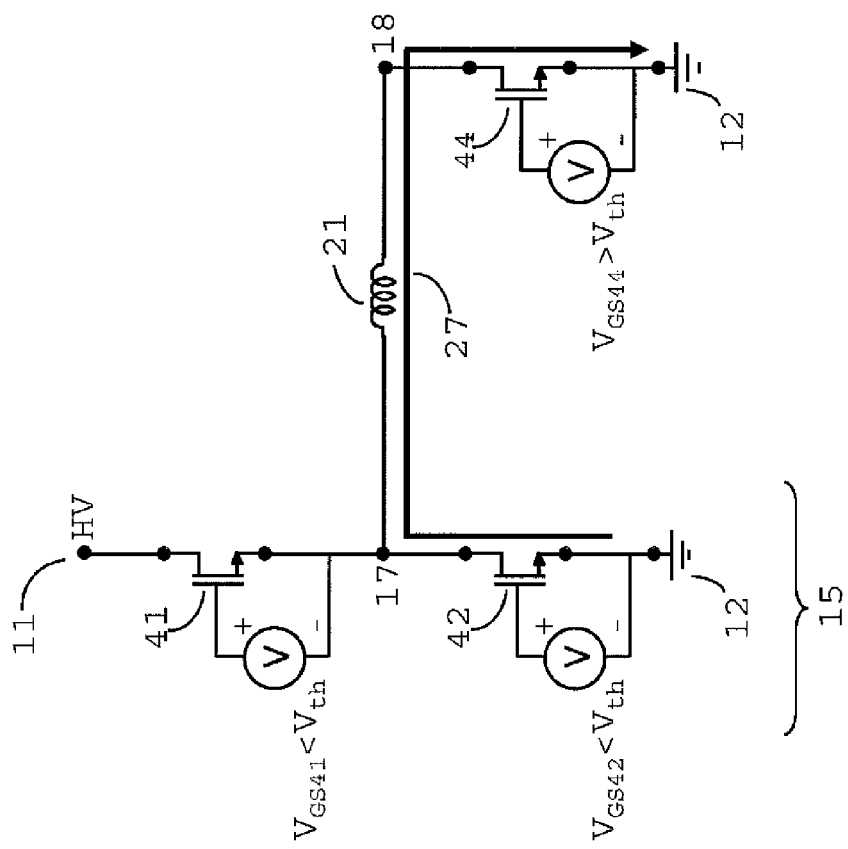
Figure 3:
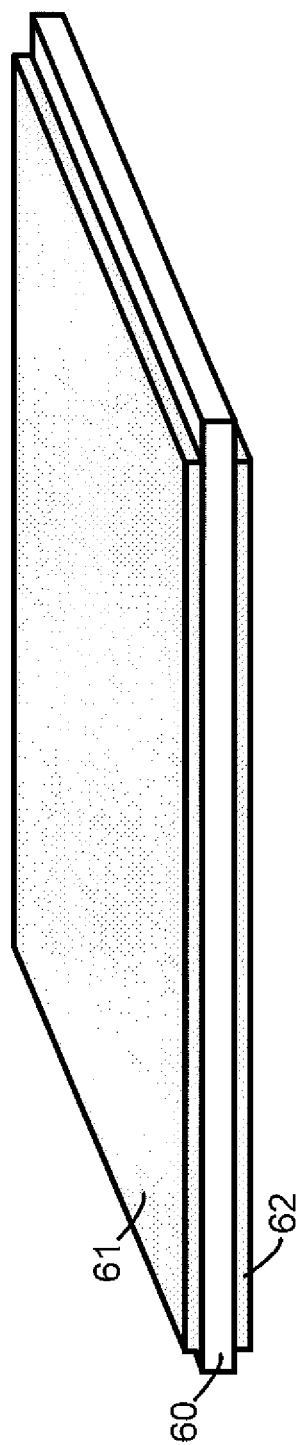
FIG. 3 is a perspective view of a prior art direct bonded copper (DBC) substrate.
Figure 4B:
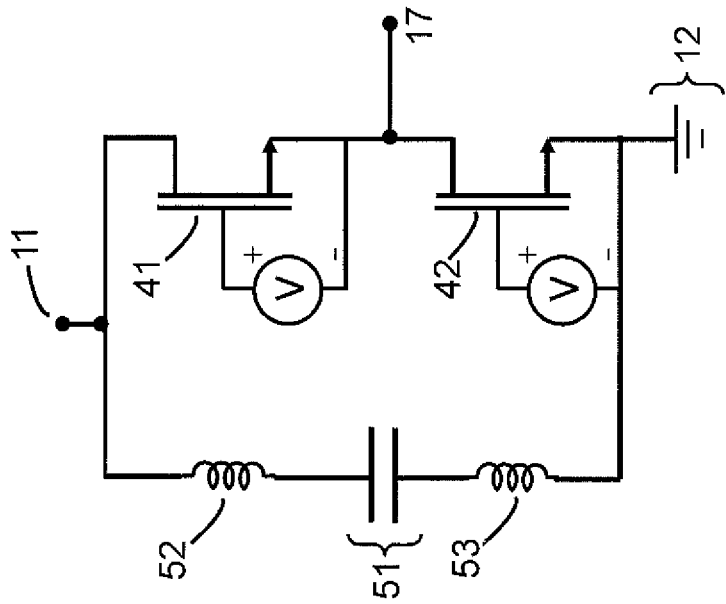
FIGS. 4a-b illustrate circuit schematics of a portion of a bridge circuit.
Figure 4A:
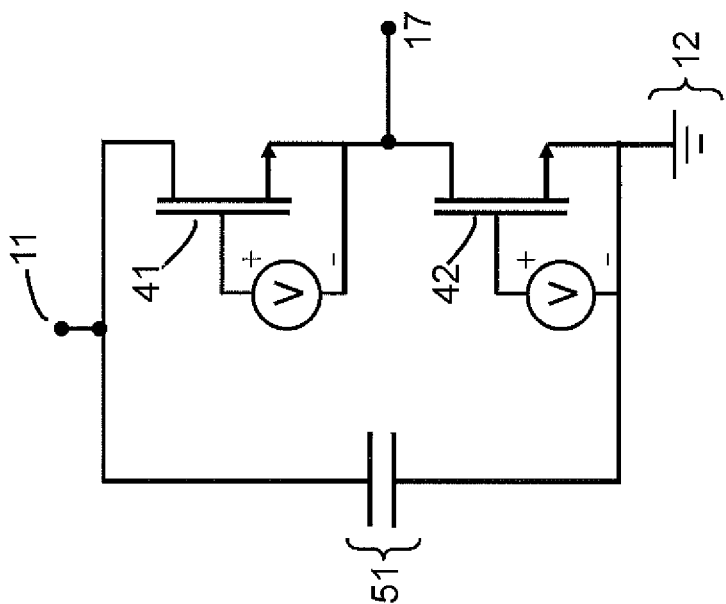

In order to ensure proper operation of circuits having a schematic circuit layout such as in FIGS. 1-2, the DC High Voltage node 11 must be maintained as an AC ground. That is, node 11 is preferably capacitively coupled to DC ground 12 by connecting one terminal of a capacitor 51 to the High Voltage node 11 and the other terminal of the capacitor to ground 12, as illustrated in FIG. 4a. Hence, when either of transistors 41 or 42 is switched on or off, the capacitor 51 can charge or discharge as needed to provide the current necessary to maintain a substantially constant voltage at the high- and low-voltage sides of the circuit. The EMI produced by higher switching rates typically results in the capacitor 51 needing to provide higher current levels over shorter periods of time in order to stabilize the circuit. In many cases, the conductive connectors between the capacitor 51 and the circuit have large parasitic inductance, represented by inductors 52 and 53 in FIG. 4b. This parasitic inductance prevents current passing through capacitor 51 from being able to switch sufficiently quickly, thereby preventing capacitor 51 from providing current at a fast enough rate to prevent voltage variations across transistors 41 or 42 after either of the transistors is switched on or off. This can result in deleterious effects such as voltage oscillations (i.e., ringing) and excessively large EMI. In particular, excessively large voltage oscillations across any of the transistors in the circuit can result in the transistor breaking down and being rendered inoperable.

Figure 5:
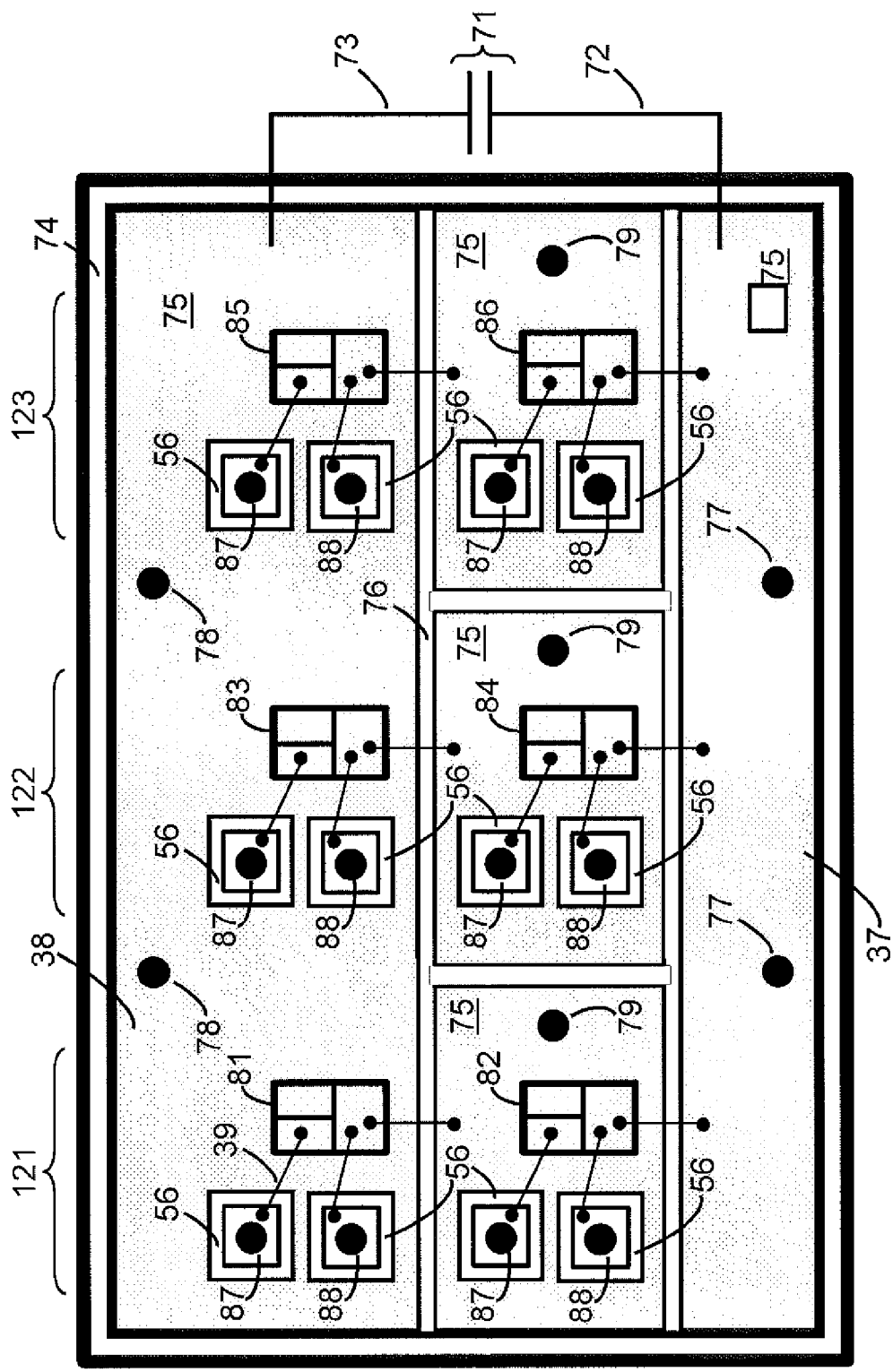
FIGS. 5-7 are plan view schematic diagrams of electronic modules featuring bridge circuits.
Figure 6:
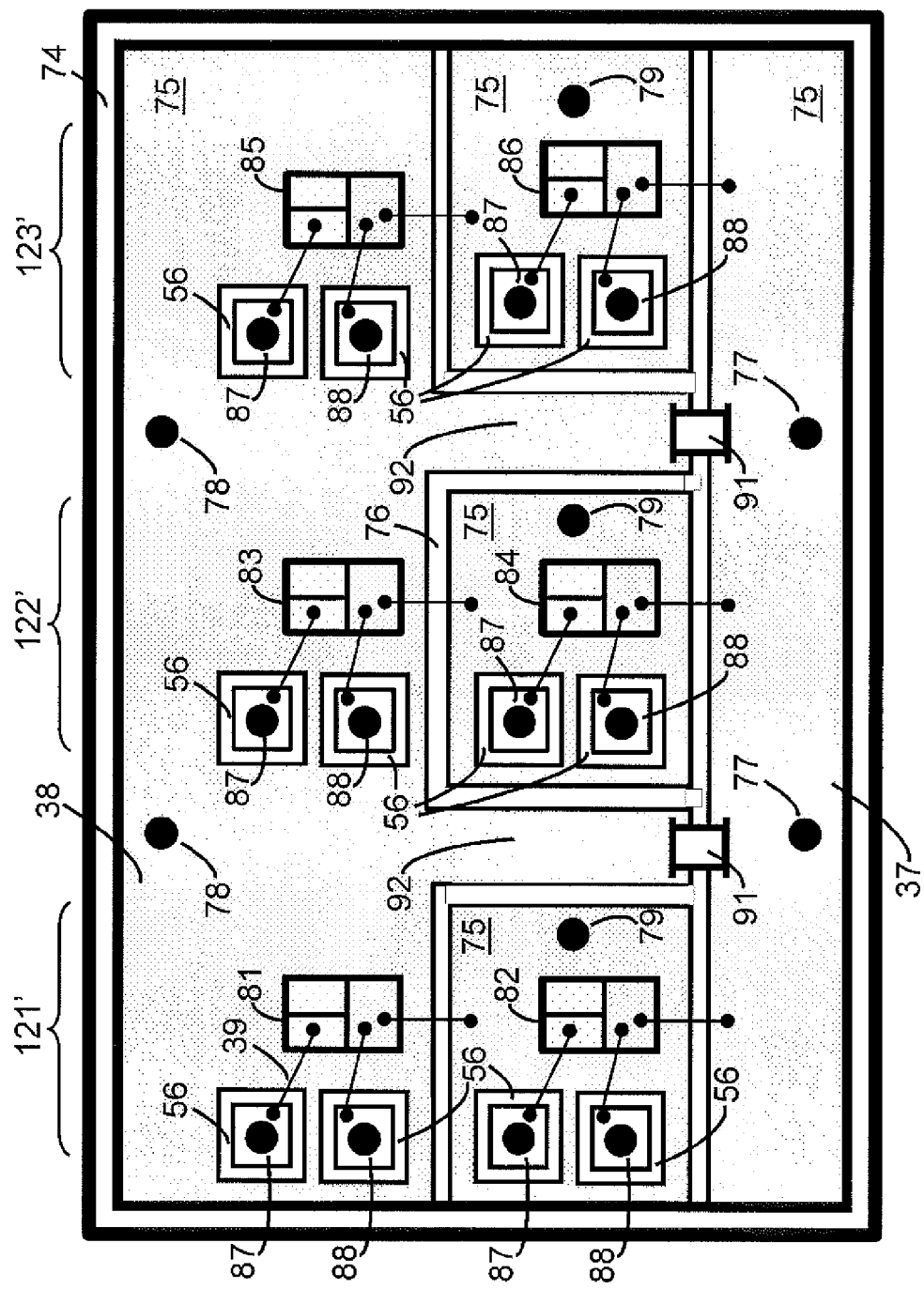
Figure 7:
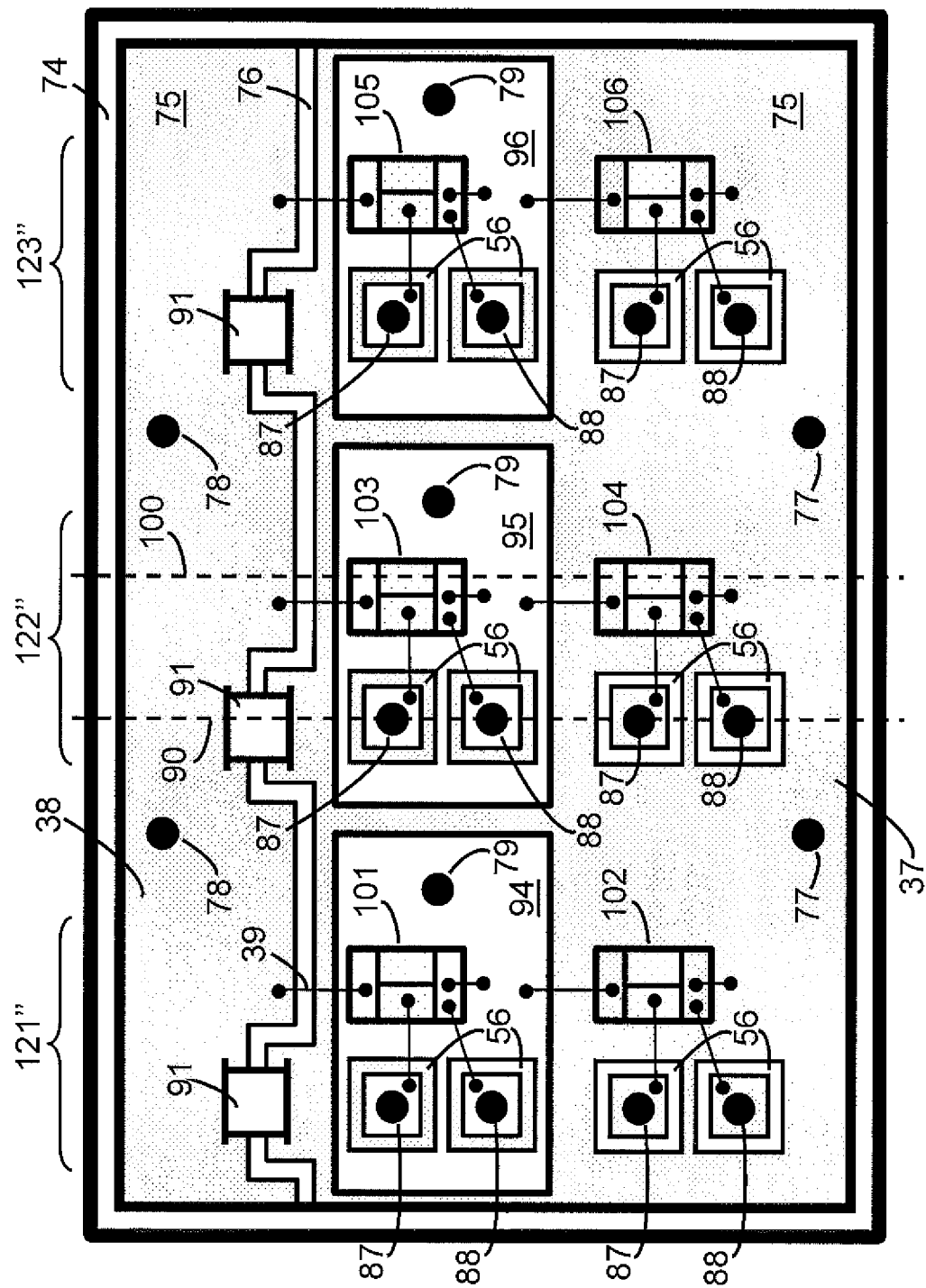

FIGS. 5-7 are schematic layouts of electronic components, i.e., bridge circuits. The circuit schematic of each of the electronic components of FIGS. 5-7 is similar to that shown in FIG. 1, except that the electronic components of FIG. 5-7 also each include a capacitor 71/91 between the high voltage and ground planes. The electronic components of FIGS. 5-7 include features designed to substantially reduce parasitic inductances in the circuit, thereby resulting in circuits that can operate at higher switching speed with lower losses.

Referring to the schematic layout of a bridge circuit illustrated in FIG. 5, the components of the bridge circuit are all mounted on a single common DBC substrate 74 having a metal layer 75 bonded to an insulating or ceramic material. Half bridge 121 includes transistors 81 and 82, half bridge 122 includes transistors 83 and 84, and half bridge 123 includes transistors 85 and 86. Transistors 81-86 are vertical transistors, each having a source and gate electrode on an opposite side of the transistor from the drain electrode, and are mounted on the substrate with the drains contacting the metal layer 75. Alternatively, lateral transistors, for which the source, gate, and drain are each on the same side of the device, could be used for transistors 81-86, in which case the drain may be connected to the metal layer 75, for example by wire bonding. Examples of lateral transistors that could be used include III-Nitride transistors such as III-Nitride high electron mobility transistors (HEMTs). As used herein, the terms III-Nitride or III-N materials, layers, devices, structures, etc., refer to a material, layer, device, or structure comprised of a compound semiconductor material according to the stoichiometric formula $Al_xIn_yGa_zN$, where x+y+z is about 1. In a III-Nitride or III-N device, such as a transistor or HEMT, the conductive channel can be partially or entirely contained within a III-N material layer.

A trench 76 is formed through the metal layer, exposing the ceramic material in the trench region and electrically isolating metal layer 75 around each of transistors 82, 84, and 86 from the remainder of metal layer 75. Leads 77, which are electrically connected to metal layer 75 in the lower portion 37 (i.e., the portion below the trench 76) of the substrate, are configured to be connected to a DC ground, thereby maintaining the metal layer 75 in the lower portion 37 at DC ground. Leads 78, which are electrically connected metal layer 75 in the upper portion 38 (i.e., the portion above the trench 76) of the substrate, are configured to be connected to a DC high voltage supply (not shown), thereby maintaining the metal layer 75 in the upper portion 38 at a DC high voltage. As used herein, two or more contacts or other items such as conductive layers or components are said to be "electrically connected" if they are connected by a material which is sufficiently conducting to ensure that the electric potential at each of the contacts or other items is substantially the same or about the same regardless of bias conditions. Gate leads 87 and source leads 88 are electrically connected to the respective gates and sources of transistors 81-86, for example with wire bonds 39 as shown (for clarity, only one wire bond is numbered 39 in FIG. 5). The gate leads 87 and source leads 88 are each electrically isolated from the drains of their respective transistors by trenches 56 formed through the entire thickness of metal layer 75 and surrounding each of the gate leads 87 and source leads 88. Output leads 79, which are configured to be connected to an inductive load (not shown), are each electrically connected to metal layer 75 in the regions surrounding transistors 82, 84, and 86, respectively.

As seen in FIG. 5, a relatively large spatial separation exists between portions 37 and 38, and so capacitor 71, which capacitively couples the ground plane in portion 37 to the high voltage plane in portion 38, is externally mounted, with conductive connectors 72 and 73 connecting the capacitor to metal layer 75 in portions 37 and 38, respectively. Because connectors 72 and 73 are relatively long to accommodate for the large spatial separation between portions 37 and 38, they tend to have large parasitic inductance, corresponding to large values of inductors 52 and 53 in FIG. 4b. As such, while the electronic component of FIG. 5 may be operable when the transistors are switched at lower switching rates and/or at low enough switching current and voltage levels with sufficiently high switching times, at higher switching rates and/or higher switching voltages or currents, the parasitic inductances in the circuit may lead to intolerably high levels of EMI and voltage fluctuations/oscillations. Specifically, if the rate of change of voltage (dV/dt) or the rate of change of current (dI/dt) through or across the transistors during transistor switching is too high, voltage fluctuations/oscillations and EMI can reduce the efficiency and performance of the circuit or cause one or more of the circuit components to fail.

FIG. 6 shows another schematic layout of an electronic component, i.e., a bridge circuit. The electronic component of FIG. 6 is similar to that of FIG. 5, except that the layout has been modified to include coupling capacitors 91 between the high voltage and ground planes that are directly over the single DBC substrate 74, thereby eliminating the need for long connectors on either side of the coupling capacitors and reducing the parasitic inductance in the circuit. Specifically, the shape of the trench 76 formed through metal layer 75 of the DBC substrate has been modified so that portion 38 includes regions 92 between transistors 82 and 84 and between transistors 84 and 86. The metal layer 75 in regions 92 extends down towards the metal layer 75 in portion 37, and is separated from the metal layer 75 in portion 37 by the width of the trench 76, which can be less than 2 cm, for example about 1 cm or less. Capacitors 91 are mounted directly over the trench 76, as shown, with a first terminal of the capacitor 91 being connected to metal layer 75 on one side of the trench and a second terminal of the capacitor 91 being connected to metal layer 75 on the opposite side of the trench. The points on metal layer 75 to which each of the two terminals of the capacitor are connected can be less than 2 cm from the trench and/or less than 4 cm from one another, thereby allowing for a compact design with low parasitic inductance.

While the layout of FIG. 6 can substantially reduce parasitic inductances in the circuit as compared to the layout of FIG. 5, any current flowing through capacitors 91 and any of transistors 81, 83, or 85 must flow through a relatively narrow region 92, which can still result in parasitic inductances in the circuit that may be too high for some applications, for example applications in which the rate at which voltage and/or current switching across or through any of the transistors is very high. While increasing the widths of regions 92 can result in lower parasitic inductance, the overall size and cost of the electronic component also increases. However, compact layouts for which current flowing between the coupling capacitors and transistors is spread over a large width of conducting material are desirable in order to improve circuit speed and performance while at the same time minimizing the footprint and material costs.

FIG. 7 shows a compact layout for a bridge circuit that further results in reduced parasitic inductances, as compared to the layouts of FIGS. 5 and 6. The compact design is achieved by using additional DBC substrates 94-96 stacked over DBC substrate 74, such that current passing through any of capacitors 91 is able to pass underneath the high-side devices 101, 103, or 105, and is therefore not confined to a relatively narrow channel, as further described below.

The bridge circuit illustrated in FIG. 7 is formed on a DBC substrate 74 and includes transistors 101-106, which are lateral transistors, having a source, gate, and drain all on the same side or on a common semiconductor layer of the device. The lateral transistors 101-106 are formed with each of the source, gate, and drain being on one or more of the device semiconductor layers, with the device semiconductor layer or layers being between DBC substrate 74 and each of the source, gate, and drain. The electronic component of FIG. 7 further includes additional DBC substrates 94-96 stacked over DBC substrate 74, with high-side transistors 101, 103, and 105 of half bridges 121"-123", respectively, being over the substrates 94, 95, and 96. As seen in FIG. 8A, which is a cross-sectional view along dashed line 100 of the electronic component of FIG. 7, DBC substrate 95, which includes metal layers 98 and 99 on opposite sides of insulating/ceramic layer 97, is secured over a section of the lower portion 37 (i.e., the portion in which metal layer 75 is connected to ground, labeled in FIG. 7) of DBC substrate 74. Metal layer 99 of DBC substrate 95 can be electrically connected to metal layer 75 of DBC substrate 74, and for example can be secured to metal layer 75 with a conductive adhesive or epoxy. Lateral power transistor 103 is formed over metal layer 98, with its source electrode wire bonded to both a source lead 88 (shown in FIG. 7 but not in FIG. 8A) and to metal layer 98 of DBC substrate 95, its gate electrode wire bonded to gate lead 87 (shown in FIG. 7 but not in FIG. 8A), and its drain electrode wire bonded to metal layer 75 in portion 38 of DBC layer 74.

Referring back to FIG. 7, output leads 79 are each electrically connected to the upper metal layer (layer 98 in FIG. 8A) of DBC substrates 94-96. Low-side transistors 102, 104, and 106, which are mounted over portion 37 of DBC substrate in sections that do not include additional DBC substrates, are each configured as follows. The source electrode is wire bonded to metal layer 75 in portion 37 and to a source lead 88, the gate electrode is wire bonded to a gate lead 87, and the drain electrode is wire bonded to the upper metal layer (i.e., the metal layer furthest from DBC substrate 74) of DBC substrates 94-96, as shown.

In the electronic component of FIG. 7, current which flows from any of capacitors 91 to the source of any of transistors 102, 104, or 106, or in the opposite direction, flows through metal layer 75 and can therefore pass underneath at least one of transistors 101, 103, or 105, since metal layer 75 extends underneath transistors 101, 103, and 105. As such, current is not confined laterally to a relatively narrow channel, as was the case in FIG. 6. Consequently, parasitic inductances in this electronic component are reduced as compared to those in the electronic component of FIG. 6. Furthermore, since narrow regions 92 included in the electronic component of FIG. 6 are not needed in the electronic component of FIG. 7, the electronic component of FIG. 7 can be made more compact and can have a smaller footprint than that of FIG. 6.

FIG. 8B, which is a cross-sectional view along dashed line 90 of the electronic component of FIG. 7, illustrates the configuration of source and gate leads 88 and 87, respectively, of transistors 103 and 104. Because of the compact design of the electronic component of FIG. 7, and specifically due to the small spacing between transistors 103 and 104, the leads 87 and 88 are bent to prevent accidental shorting of the devices to one another. That is, the leads 87 and 88 of transistor 103 include a bend in a direction away from transistor 104, and the leads 87 and 88 of transistor 104 include a bend in a direction away from transistor 103, in order to increase the minimum spacing 57 between the leads of adjacent devices.

Figure 9A:
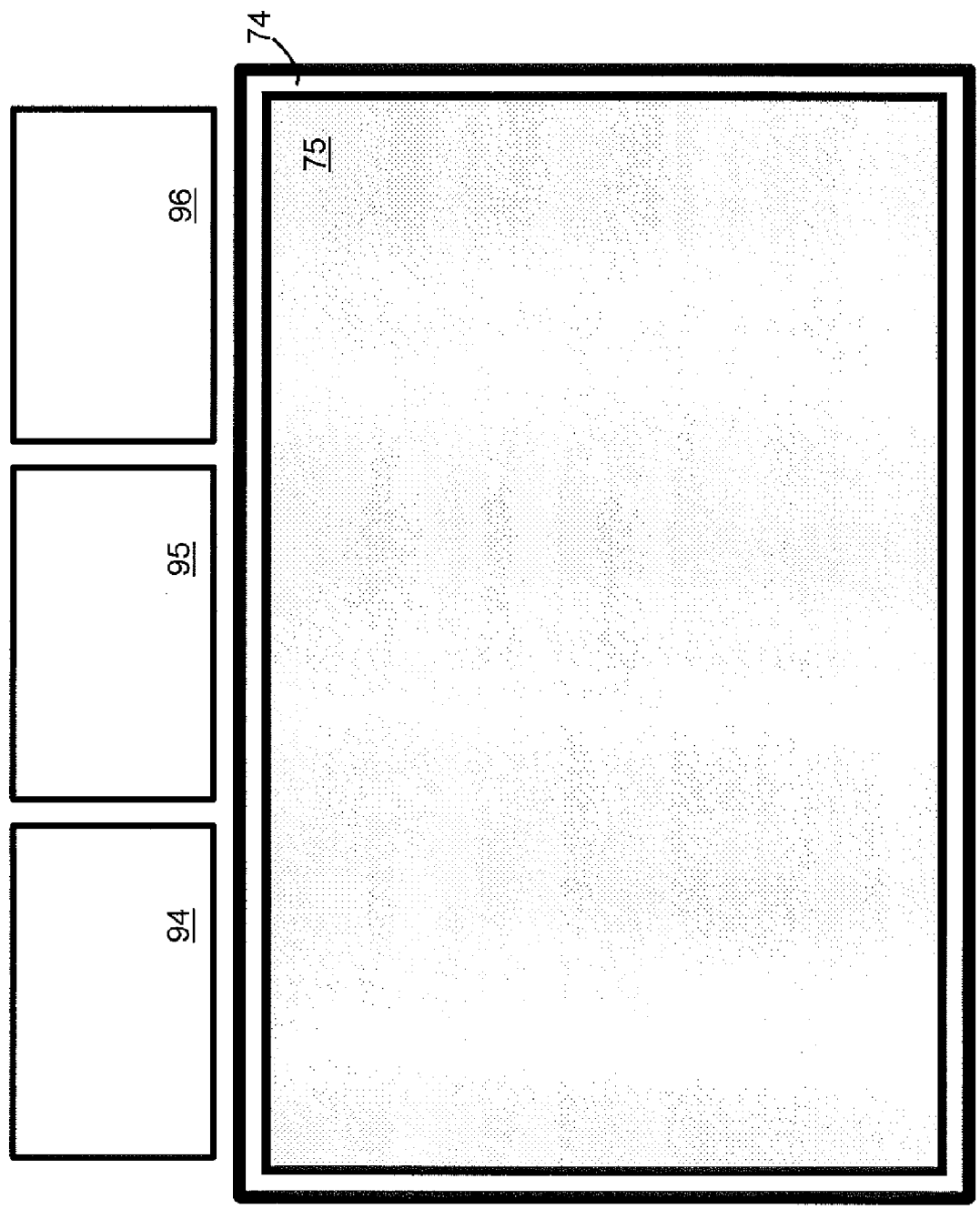
FIGS. 9A-E illustrate a process of forming the electronic module of FIG. 7.
Figure 9B:
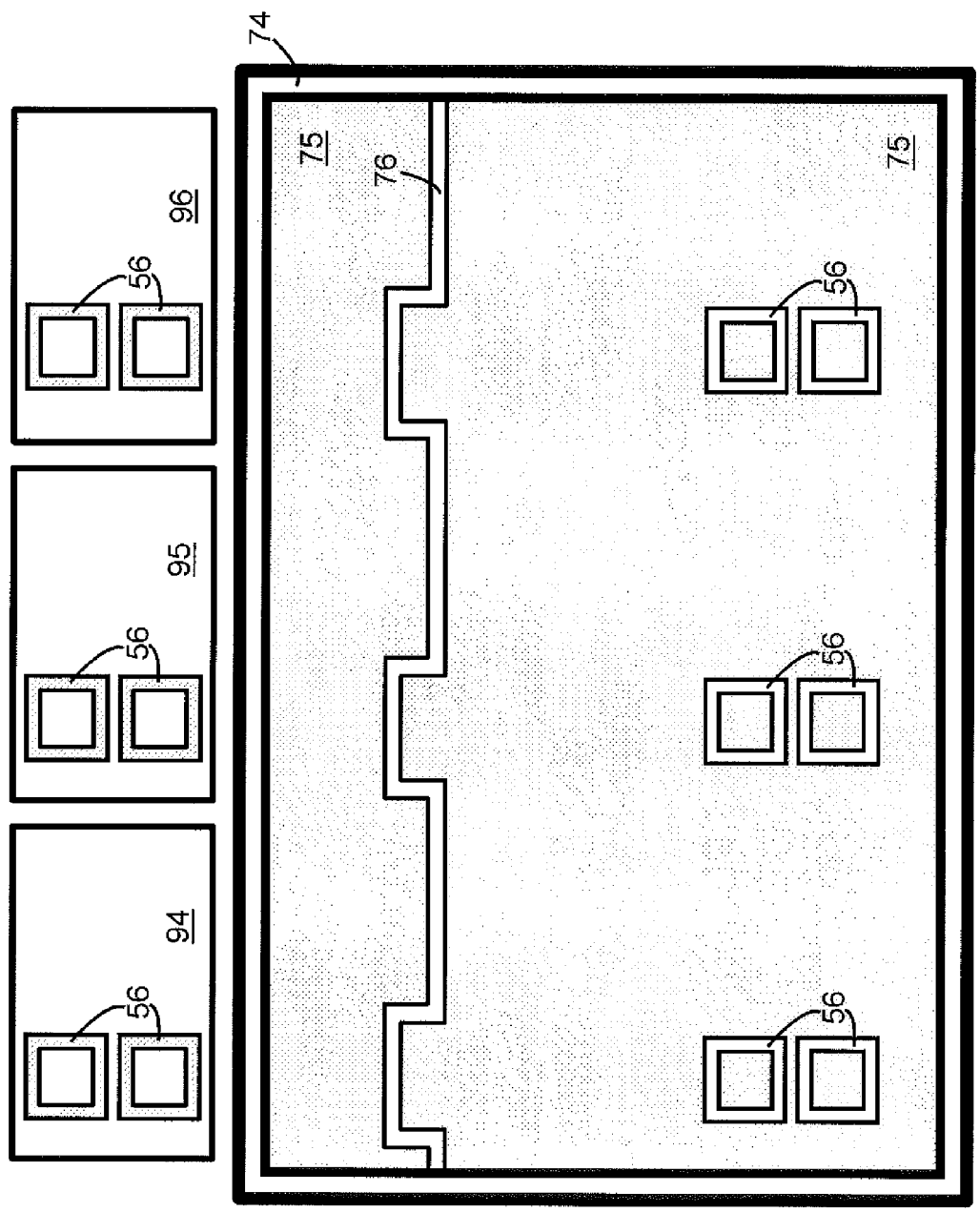
Figure 9C:
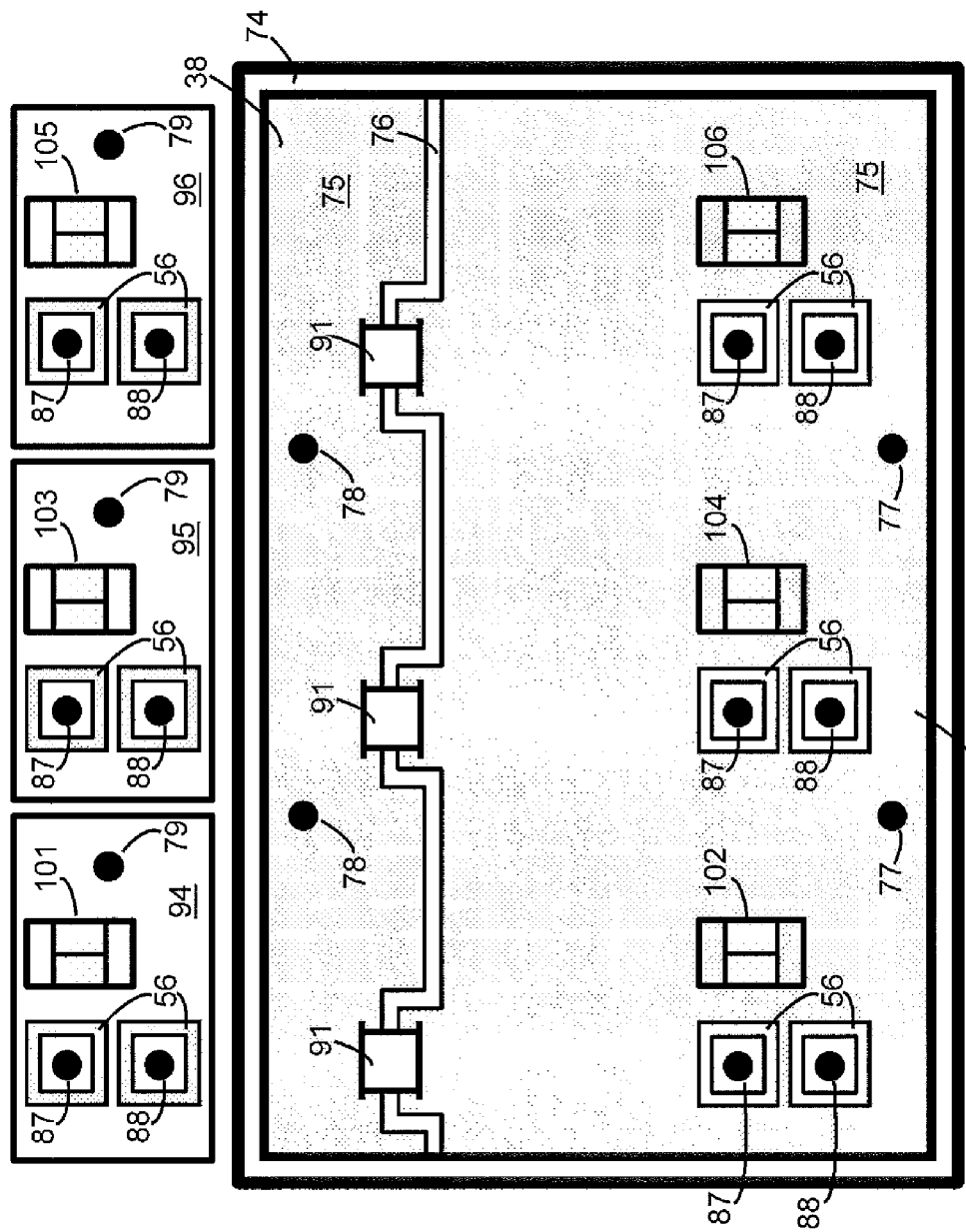
Figure 9D:
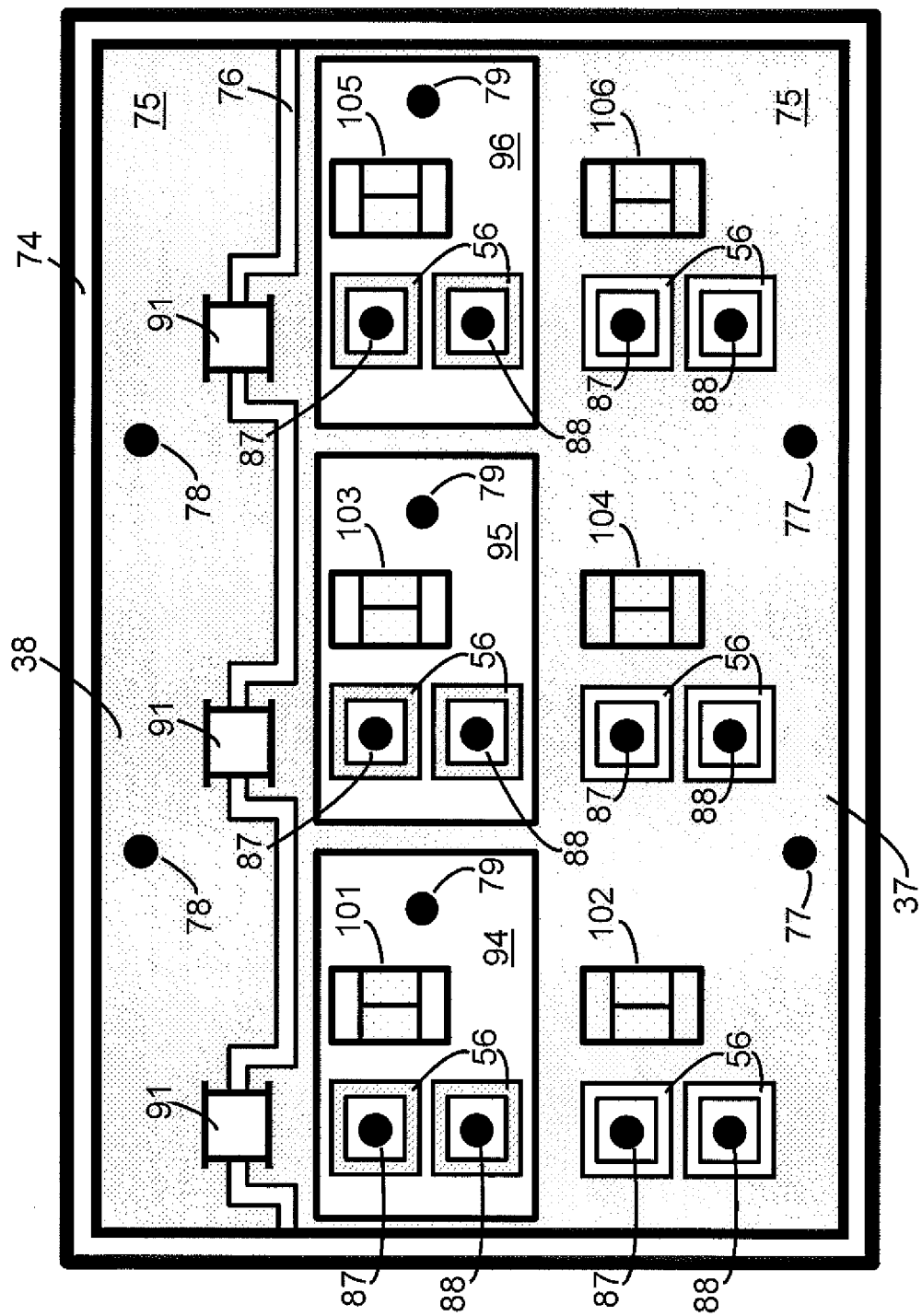
Figure 9E:
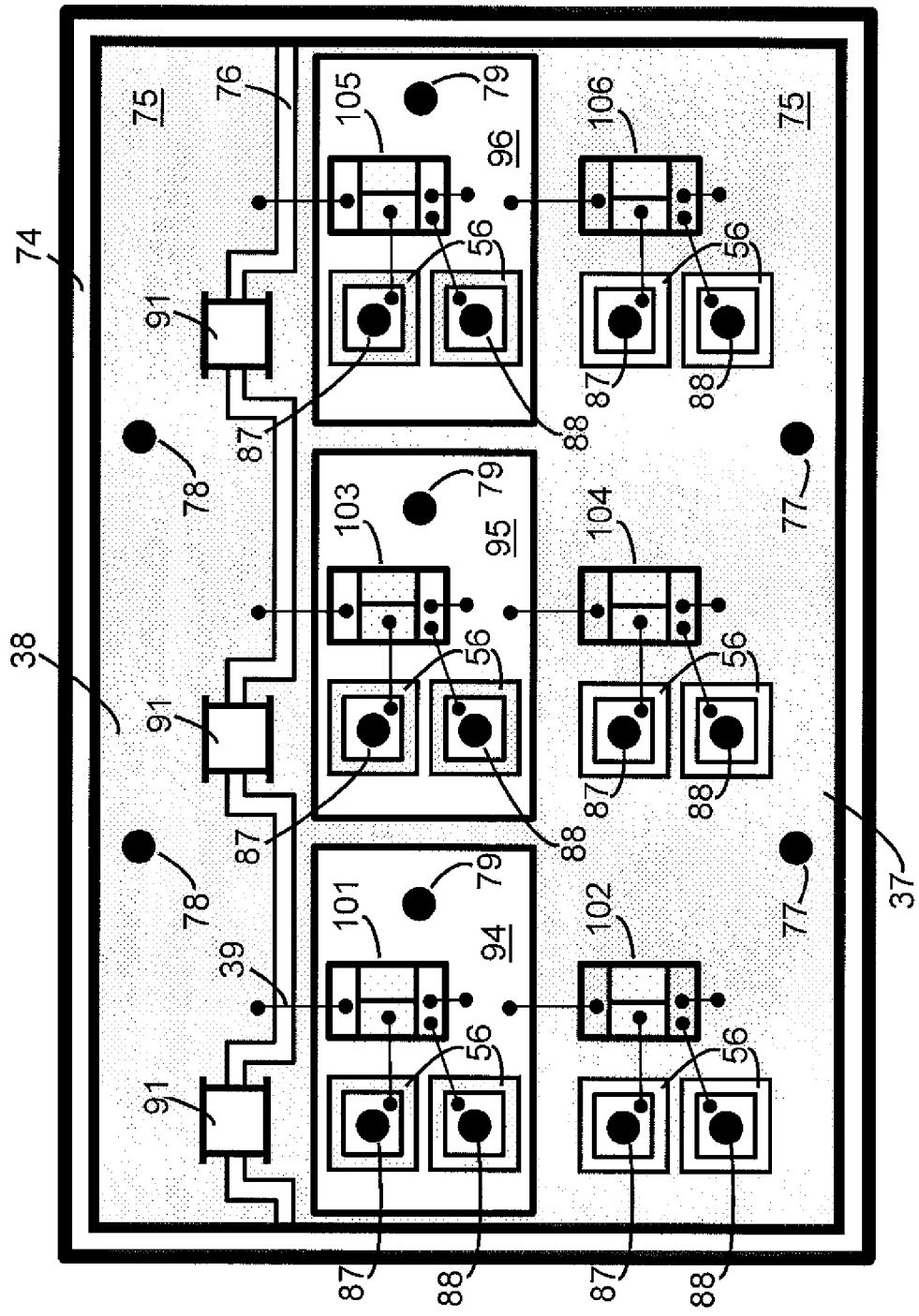

An example method of forming the electronic component of FIG. 7 is illustrated in FIGS. 9A-9E. Referring to FIG. 9A, a first DBC substrate 74, along with DBC substrates 94-96, are provided. DBC substrates 94-96 each have a cross-sectional area which is smaller than that of DBC substrate 74. Referring to FIG. 9E, in particular, since each of DBC substrates 94-96 must fit within the area of DBC substrate 74 without overlapping one another, DBC substrates 94-96 each have a cross-sectional area which is less than ⅓ that of DBC substrate 74. Furthermore, since sufficient room needs to be maintained for portion 38 as well as for transistors 102, 104, and 106, DBC substrates 94-96 can each have a cross-sectional area which is less than ⅙ that of DBC substrate 74.

Referring to FIG. 9B, trench 76 is then formed through metal layer 75 of DBC substrate 74, and trenches 56 are formed in the upper metal layers of each of DBC substrates 75 and 94-96. Next, as shown in FIG. 9C, transistors 101, 103, and 105 are each secured to the upper metal surfaces of DBC substrates 94, 95, and 96, respectively, and transistors 102, 104, and 106 are secured to metal layer 75 in portion 37 (i.e., the portion of DBC substrate 74 that is on the same side of trench 76 as leads 77) of DBC substrate 74. Capacitors 91 are secured over trench 76 with one terminal contacting metal layer 75 in portion 37 and the opposite terminal contacting metal layer 75 in portion 38 (i.e., the portion of DBC substrate 74 that is on the same side of trench 76 as leads 78). Ground leads 77 are secured and electrically connected to metal layer 75 in portion 37, high voltage leads 78 are secured and electrically connected to metal layer 75 in portion 38, and output leads 79 are secured to and electrically connected to the upper metal surfaces of each of DBC substrates 94-96. Source leads 88 and gate leads 87 are attached proximal to each of transistors 101-106, as shown.

Next, as illustrated in FIG. 9D, DBC substrates 94-96 are secured over DBC substrate 74, with metal layer 75 of DBC substrate 74 contacting each of the bottom metal layers of DBC substrates 94-96. Finally, wire bonds 39 are formed, resulting in the electronic component shown in FIG. 9E, which is the same as that of FIG. 7 (for the sake of clarity, only one wire bond 39 is labeled in FIGS. 7 and 9E).

Transistors 101-106 could be enhancement-mode (E-mode) transistors, having a positive threshold voltage, or depletion-mode (D-mode) transistors, having a negative threshold voltage. In many high voltage or power switching applications, it is preferable that the transistors be enhancement-mode devices in order to prevent damage to the circuit in case of failure of any of transistors 101-106. Transistors 101-106 can also include an insulating or semi-insulating layer, for example a semi-insulating substrate such as $Al_2O_3$, silicon, or silicon carbide, between some or all of the device semiconductor layers and the DBC substrate on which they are mounted, in order to electrically isolate portions of the device from the DBC substrate.

Figure 10B:
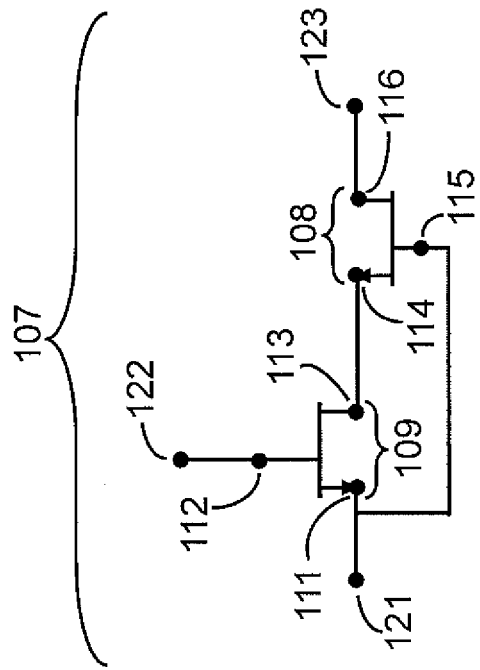
FIGS. 10A-B illustrate electronic devices that can be used in electronic modules.
Figure 10A:
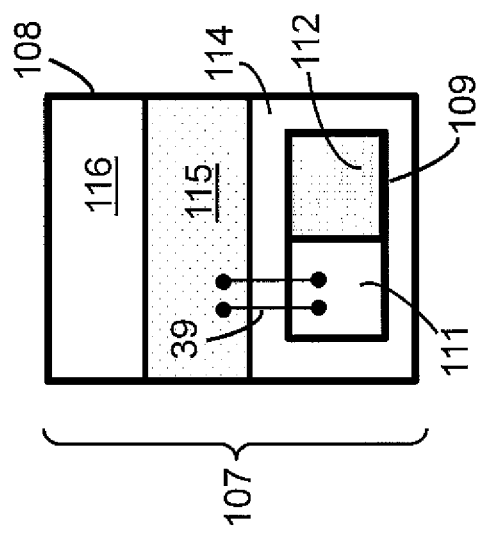

While in FIG. 7 transistors 101-106 are each shown to be single lateral transistors, other devices could be used instead. For example, a switching device such as hybrid device 107, shown in FIGS. 10A and 10B, could be used in place of any or each of switching transistors 101-106. Since switching devices consisting of high-voltage enhancement-mode transistors can be difficult to fabricate reliably, one alternative to a single high-voltage E-mode transistor is to combine a high-voltage D-mode transistor 108 with a low-voltage E-mode transistor 109 in the configuration of FIGS. 10A and 10B to form a hybrid device 107. Hybrid device 107 can be operated in the same way as a single high-voltage E-mode transistor, and in many cases achieves the same or similar output characteristics as a single high-voltage E-mode transistor. FIG. 10A shows a plan view schematic diagram of hybrid device 107, and FIG. 10B shows a circuit schematic of hybrid device 107. Hybrid device 107 includes a high-voltage D-mode transistor 108 and a low-voltage E-mode transistor 109. In the configuration illustrated in FIGS. 10A and 10B, E-mode transistor 109 is a vertical transistor, having its drain electrode 113 on the opposite side of the device's semiconductor layers from its source electrode 111 and gate electrode 112, and D-mode transistor 108 is a lateral transistor, having its source electrode 114, gate electrode 115, and drain electrode 116 all on the same side of the device's semiconductor layers. However, other configurations for each of transistors 108 and 109 are possible as well. In some implementations, the D-mode transistor 108 is a III-Nitride transistor. In some implementations, the E-mode transistor 109 is a silicon-based transistor, while in other implementations it is a III-Nitride transistor.

The source electrode 111 of the low-voltage E-mode transistor 109 and the gate electrode 115 of the high-voltage D-mode transistor 108 are both electrically connected together, for example with wire bonds 39 (shown in FIG. 10A), and together form the source 121 (shown in FIG. 10B) of the hybrid device 107. The gate electrode 112 of the low-voltage E-mode transistor 109 forms the gate 122 (shown in FIG. 10B) of the hybrid device 107. The drain electrode 116 of the high-voltage D-mode transistor 108 forms the drain 123 (shown in FIG. 10B) of the hybrid device 107. The source electrode 114 of the high-voltage D-mode transistor 108 is electrically connected to the drain electrode 113 of the low-voltage E-mode transistor 109. As seen in FIG. 10A, drain electrode 113, which is on the opposite side of the E-mode transistor 109 from the source and drain electrodes 111 and 112, respectively, can be electrically connected to source electrode 114 by mounting the low-voltage E-mode transistor 109 directly on top of or over the source electrode 114 with the drain electrode 113 (which is on the bottom of E-mode transistor 109 and is shown in FIG. 10B) directly contacting the source electrode 114, for example by using a conductive solder or resin. As such, the footprint (and therefore the cross-sectional area) of the low-voltage E-mode transistor 109 can be smaller than that of the high-voltage D-mode transistor 108, and in particular the footprint of the low-voltage E-mode transistor 109 can be smaller than that of the source electrode 114 high-voltage D-mode transistor 108.

Figure 11B:
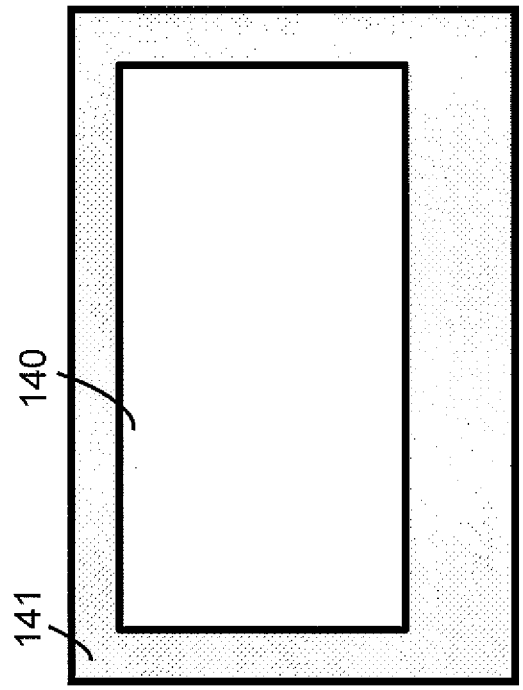
FIGS. 11A-F illustrate a process for manufacturing an electronic device that can be used in electronic modules.
Figure 11A:
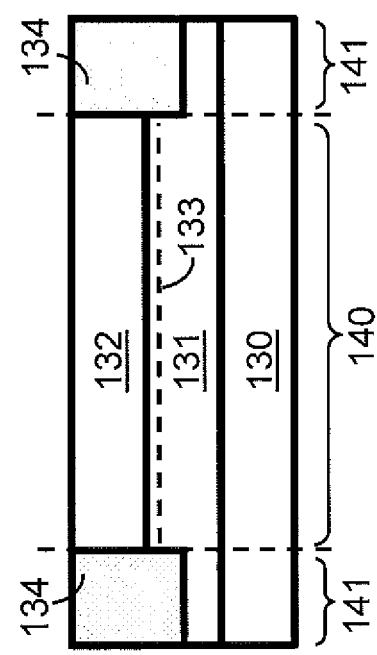

A method for forming a hybrid device 107 such as that shown in FIG. 10A is illustrated in FIGS. 11A-11F. First, the high-voltage D-mode transistor 108 is formed, as shown in FIGS. 11A-11E. Referring to FIG. 11A, a III-Nitride material structure which includes III-Nitride layers 131 and 132 is formed on a substrate 130. A two-dimensional electrode gas (2DEG) channel 133 is induced in the III-Nitride material structure as a result of a compositional difference between layers 131 and 132. Next, a device active area 140 and a non-active area 141 are defined as follows. The non-active area 141 is treated such that the 2DEG channel 133 is removed from the non-active area 141 but remains in the active area. Such a treatment can include implanting regions 134 with ions, as shown in FIG. 11A. Alternatively, the treatment can include etching away some or all of the III-Nitride material layers 131 and/or 132 in the non-active area 141. For example, the etch can be performed to a depth that is greater than the depth of the 2DEG channel 133, such that the material which contained the 2DEG channel 133 is removed in the non-active area 141. A plan view (top view) of the structure of FIG. 11A is shown in FIG. 11B.

Figure 11D:
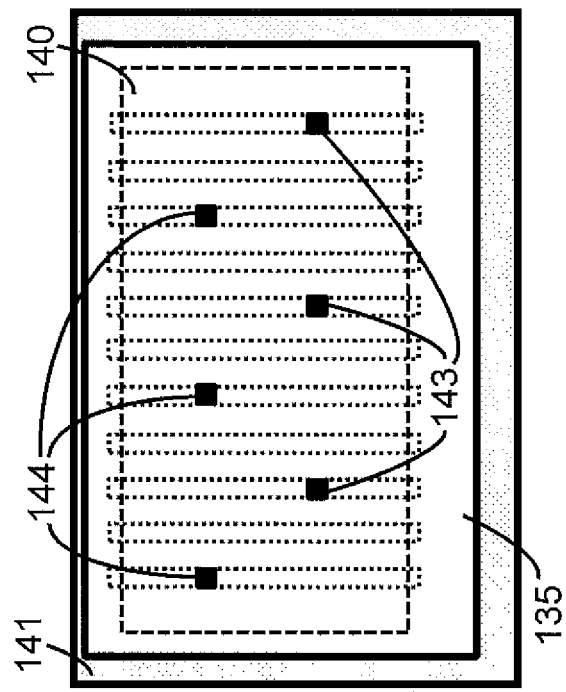
Figure 11C:
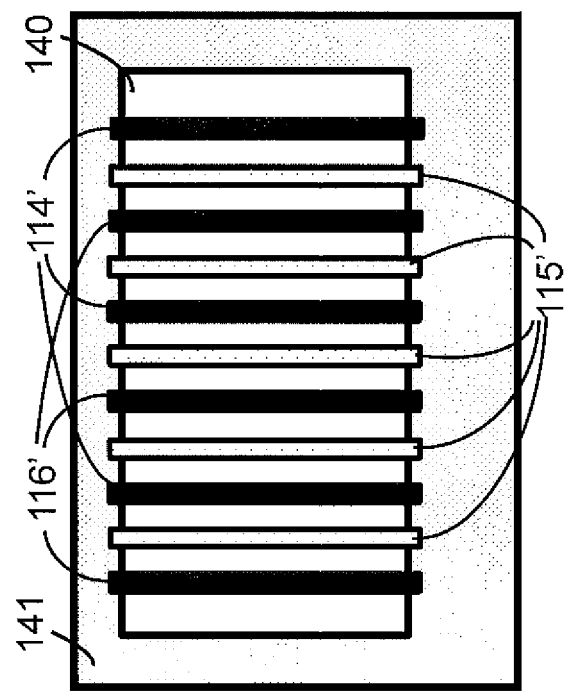

Next, as shown in FIG. 11C, source fingers 114', gate fingers 115', and drain fingers 116' are formed over the III-Nitride layers in the active area 140 of the device. The source and drain fingers 114' and 116', respectively, form ohmic contacts to the 2DEG channel 133, and the gate fingers 115' modulate the charge density in the 2DEG channel 133 directly beneath the gate fingers 115'. As shown in FIG. 11D, an insulator layer 135 is formed over the entire device active area 140, and optionally over the entire non-active area 141 as well. In FIG. 11D, the perimeters of the device active area, as well as those of the source, gate, and drain fingers, are shown as dashed lines to indicate their position beneath the insulator layer 135. Next, vias 143 are etched through the entire thickness of the insulator layer 135 over portions of the source fingers 114', and vias 144 are etched through the entire thickness of the insulator layer 135 over portions of the drain fingers 116'. Although not shown in FIG. 11D, vias are formed through the entire thickness of the insulator layer 135 over the gate fingers 115' as well.

Figure 11F:
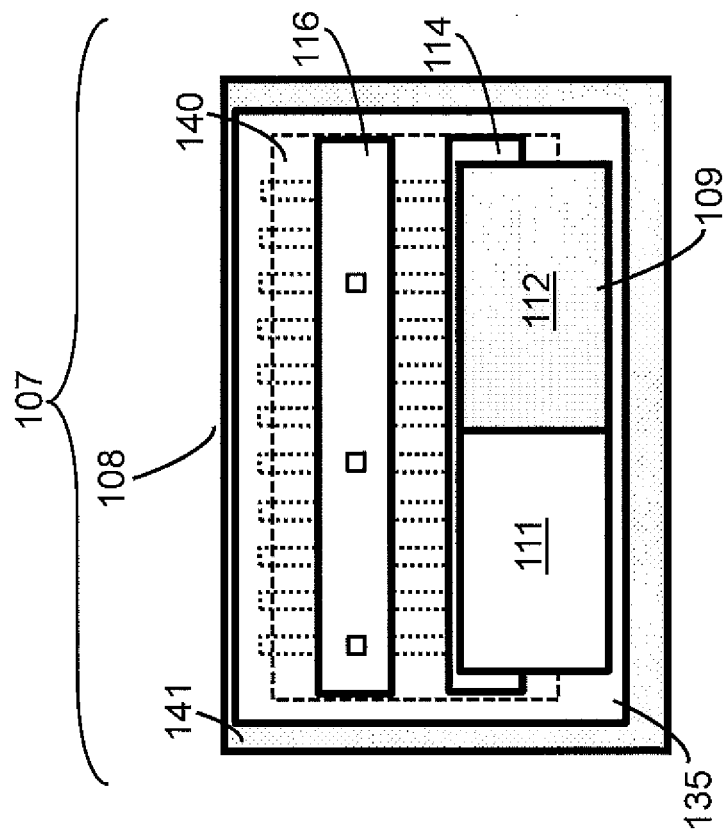
Figure 11E:
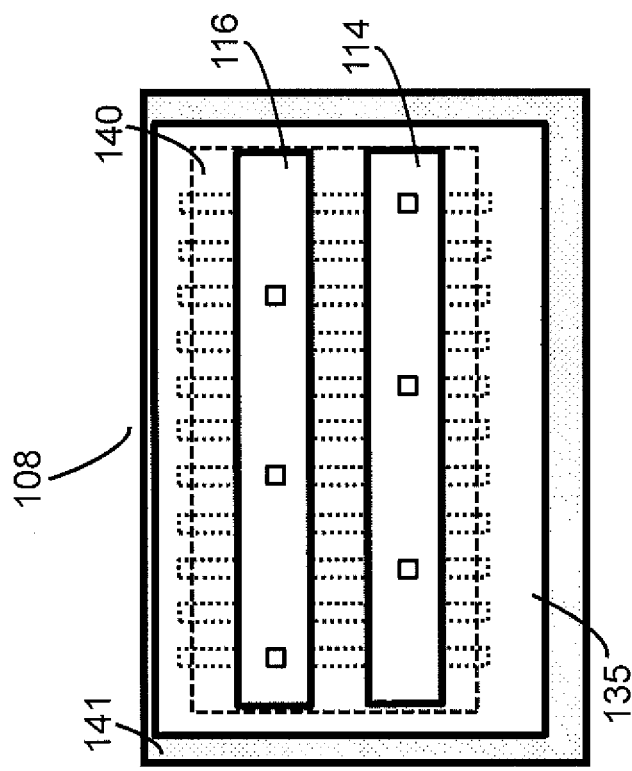

Next, as seen in FIG. 11E, source and drain electrodes 114 and 116, respectively, are formed on insulator layer 135. Source electrode 114 is formed over vias 143 (shown in FIG. 11D) and contacts the source fingers 114' (FIG. 11C) in these vias, and drain electrode 116 is formed over vias 144 (shown in FIG. 11D) and contacts the drain fingers 116' (FIG. 11C) in these vias, thereby completing D-mode transistor 108. Although not shown, a gate electrode is also formed over insulator layer 135 which contacts gate fingers 115' (shown in FIG. 11C).

Hybrid device 107 is then formed by connecting E-mode transistor 109 to D-mode transistor 108 as shown in FIG. 11F. E-mode transistor 109 is placed directly over the source electrode 114 of D-mode transistor 108, with the drain electrode of E-mode transistor 109 directly contacting source electrode 114 of D-mode transistor 108. As shown in FIG. 11F, the upper portion of E-mode transistor 109 is directly over the active device area 140 of D-mode transistor 108, while the lower portion of E-mode transistor 109 is directly over the non-active device area 141 of D-mode transistor 108. Although not shown in FIG. 11F, source electrode 111 of E-mode transistor 109 is connected to the gate electrode 115 of D-mode transistor 108, for example with wirebonds, as was shown in FIG. 10A.

Although not shown in FIGS. 11E-11F, it is possible to extend the source electrode 114 over the non-active area 141 and have E-mode transistor 109 be entirely over the non-active device area 141 of D-mode transistor 108. This can be preferable in that it allows for more effective dissipation of heat from E-mode transistor 109 during operation, since the average temperature in the active device area 140 of D-mode transistor 108 is greater than that in the non-active area 141. If heat generated during operation of E-mode transistor 109 is not dissipated sufficiently, the temperature of E-mode transistor 109 increases, which can lead to lower efficiency and/or device failure. However, having at least a portion of E-mode transistor 109 over the active device area 140 reduces the material costs as well as the total footprint of the device.

In order for heat to be effectively dissipated from E-mode transistor 109 during operation in structures where the E-mode transistor 109 is at least partially over the active device area 140 of the D-mode transistor 108, the thermal resistance between the E-mode transistor 109 and the D-mode transistor 108 can be made as small as possible. This can be achieved by increasing the cumulative area of all the vias 143 that are below source electrode 114, so that the ratio of the total via area to the total area of source electrode 114 is as large as possible. For example, the total via area can be at least 10% of the total area of source electrode 114.

As used herein, a "hybrid enhancement-mode electronic device or component", or simply a "hybrid device or component", is an electronic device or component formed of a depletion-mode transistor and a enhancement-mode transistor, where the depletion-mode transistor is capable of a higher operating and/or breakdown voltage as compared to the enhancement-mode transistor, and the hybrid device or component is configured to operate similarly to a single enhancement-mode transistor with a breakdown and/or operating voltage about as high as that of the depletion-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage (i.e., a voltage larger than the maximum voltage that the enhancement-mode transistor is capable of blocking) applied to the third node (drain node) relative to the source node. When the gate node is held at a sufficiently positive voltage (i.e., greater than the threshold voltage of the enhancement-mode transistor) relative to the source node, current passes from the source node to the drain node or from the drain node to the source node when a sufficiently positive voltage is applied to the drain node relative to the source node. When the enhancement-mode transistor is a low-voltage device and the depletion-mode transistor is a high-voltage device, the hybrid component can operate similarly to a single high-voltage enhancement-mode transistor. The depletion-mode transistor can have a breakdown and/or maximum operating voltage that is at least two times, at least three times, at least five times, at least ten times, or at least twenty times that of the enhancement-mode transistor.

As used herein, a "high-voltage device", such as a high-voltage transistor, is an electronic device which is optimized for high-voltage switching applications. That is, when the transistor is off, it is capable of blocking high voltages, such as about 300V or higher, about 600V or higher, about 1200V or higher, or about 1700V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, or other suitable blocking voltage required by the application. In other words, a high-voltage device can block any voltage between 0V and at least $V_{max}$, where $V_{max}$ is the maximum voltage that could be supplied by the circuit or power supply. In some implementations, a high-voltage device can block any voltage between 0V and at least $2*V_{max}$. As used herein, a "low-voltage device", such as a low-voltage transistor, is an electronic device which is capable of blocking low voltages, such as between 0V and $V_{low}$ (where $V_{low}$ is less than $V_{max}$), but is not capable of blocking voltages higher than $V_{low}$. In some implementations, $V_{low}$ is equal to about $|V_{th}|$, greater than $|V_{th}|$, about $2*|V_{th}|$, about $3*|V_{th}|$, or between about $|V_{th}|$ and $3*|V_{th}|$, where $|V_{th}|$ is the absolute value of the threshold voltage of a high-voltage transistor, such as a high-voltage-depletion mode transistor, contained within the hybrid component in which a low-voltage transistor is used. In other implementations, $V_{low}$ is about 10V, about 20V, about 30V, about 40V, or between about 5V and 50V, such as between about 10V and 40V. In yet other implementations, $V_{low}$ is less than about $0.5*V_{max}$, less than about $0.3*V_{max}$, less than about $0.1*V_{max}$, less than about $0.05*V_{max}$, or less than about $0.02*V_{max}$.

In typical power switching applications in which high-voltage switching transistors are used, the transistor is during the majority of time in one of two states. In the first state, which is commonly referred to as the "on state", the voltage at the gate electrode relative to the source electrode is higher than the transistor threshold voltage, and substantial current flows through the transistor. In this state, the voltage difference between the source and drain is typically low, usually no more than a few volts, such as about 0.1-5 volts. In the second state, which is commonly referred to as the "off state", the voltage at the gate electrode relative to the source electrode is lower than the transistor threshold voltage, and no substantial current, apart from off-state leakage current, flows through the transistor. In this second state, the voltage between the source and drain can range anywhere from about 0V to the value of the circuit high voltage supply, which in some cases can be as high as 100V, 300V, 600V, 1200V, 1700V, or higher, but can be less than the breakdown voltage of the transistor. In some applications, inductive elements in the circuit cause the voltage between the source and drain to be even higher than the circuit high voltage supply. Additionally, there are short times immediately after the gate has been switched on or off during which the transistor is in a transition mode between the two states described above. When the transistor is in the off state, it is said to be "blocking a voltage" between the source and drain. As used herein, "blocking a voltage" refers to the ability of a transistor, device, or component to prevent significant current, such as current that is greater than 0.001 times the average operating current during regular on-state conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the average operating current during regular on-state conduction.

Figure 12:
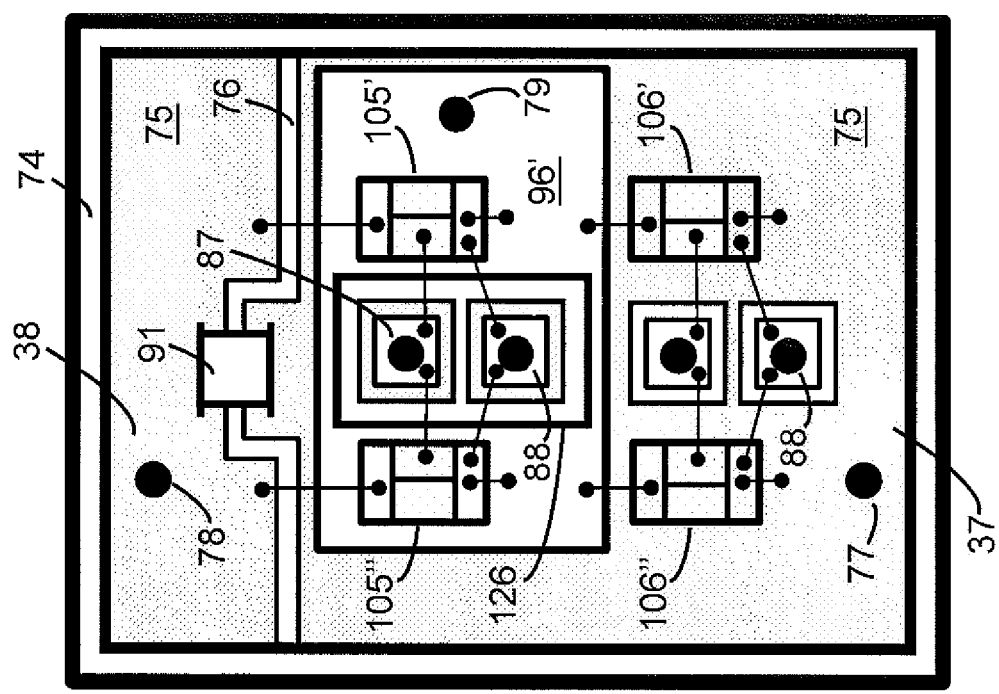
FIG. 12 is a plan view schematic diagram of an electronic module featuring a half bridge.

In some cases, the transistors of half bridges such as 121"-123" of FIG. 7 are not capable of carrying sufficiently large currents for the particular circuit application. In these cases, half bridges 121"-123" can be modified such the high-side and low-side transistors are each replaced by two transistors connected in parallel. A layout for such a half bridge configuration is illustrated in FIG. 12. The layout of FIG. 12 is optimized to minimize parasitic inductances between parallel connected transistors.

In the half bridge of FIG. 12, high-side transistors 105' and 105" are connected in parallel, with their respective sources and drains electrically connected, as are low-side transistors 106' and 106". The sources of transistors 105' and 105" are connected to a common source lead, and the gates of transistors 105' and 105" are connected to a common gate lead. The sources of transistors 106' and 106" are connected to a common source lead, and the gates of transistors 106' and 106" are connected to a common gate lead. The source and gate leads 88 and 87, respectively, of transistors 105'/105" are both on a third DBC substrate 126. Trenches are etched through the upper metal layer of DBC substrate 126 in order to electrically isolate leads 88 and 87 from one another, and from the remaining portions of the upper metal layer of DBC substrate 126. As seen in FIG. 12, one of the trenches surrounds source lead 88, and the other trench surrounds gate lead 87. DBC substrate 126 is mounted directly over DBC substrate 96', such that the upper metal layer of DBC substrate 96' passes underneath and is continuous beneath DBC substrate 126. Having the upper metal layer of DBC substrate 96' be continuous reduces parasitic inductances between the sources of transistors 105' and 105", and between the drains of transistors 106' and 106", thereby improving performance during switching.

The circuits described herein are designed such that the transistors can be switched at high switching rates without destabilizing the circuit or causing damage to circuit components. For example, when transistors such as III-N HEMTs, which are typically capable of high switching rates, are used for transistors 105'/105" and 106'/106", voltage switching rates dV/dt of greater than 40 Volts/nanosecond and current switching rates dI/dt of greater than 5 Amps/nanosecond are possible without causing the voltage across any of the transistors during switching to exceed $2*V_{high}$, where $V_{high}$ is the circuit high voltage. In some cases, voltage switching rates dV/dt of greater than 90 Volts/nanosecond and current switching rates dI/dt of greater than 10 Amps/nanosecond are possible without causing the voltage across any of the transistors during switching to exceed $2*V_{high}$ or $1.5*V_{high}$.

Figure 13A:
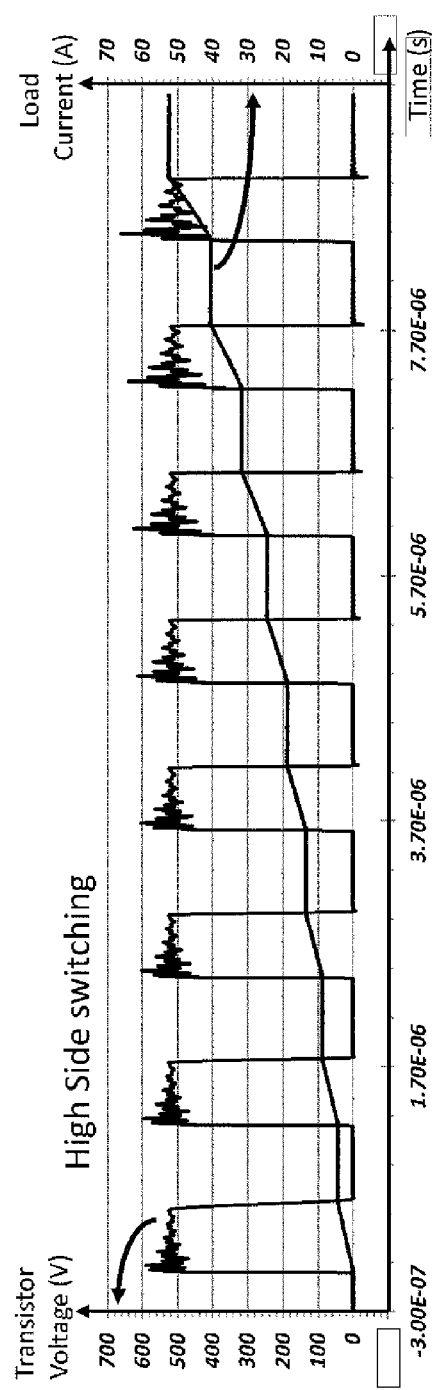
FIGS. 13A-B are plots of current and voltage characteristics of a power inverter during operation.
Figure 13B:
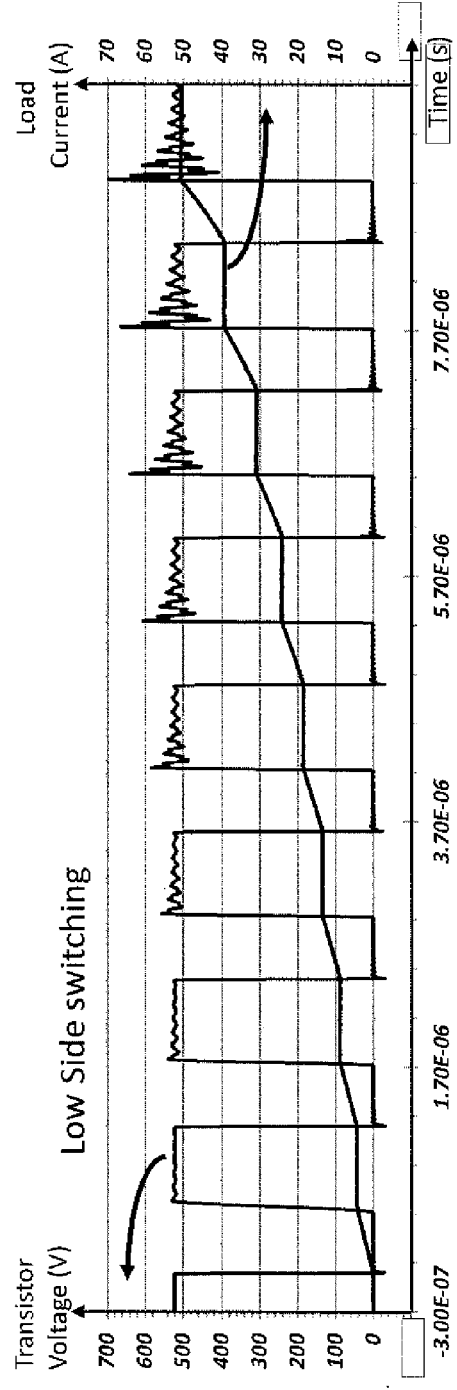

FIGS. 13A and 13B illustrate the current and voltage device characteristics during a switching sequence for switching the high-side device (FIG. 13A) and low-side device (FIG. 13B) of a half-bridge in order to increase the load (i.e., inductor) current from 0 Amps to 50 Amps, where the half bridge power inverter was operated with a 520V high voltage supply (i.e., a power supply providing a voltage greater than 500V). The half-bridge was designed similarly to that of FIG. 12, except that hybrid switching devices such as those of FIGS. 10A-10B or FIG. 11F were used in place of transistors 105'/105" and 106'/106". The high-side device refers to the device which is connected to the high-voltage supply, for example transistors 105'/105" in FIG. 12. The low-side device refers to the device which is connected to DC ground, for example devices 106'/106" in FIG. 12. The switching time for the transistors was set to 3 nanoseconds, which is less than 5 nanoseconds, and substantially less than the 10 nanosecond switching times that would be required of circuits with higher parasitic inductances. As seen, when the high-side device is switched from an on-state in which it conducted 50 Amps or less, such as between 40 and 50 Amps, to an off state in which the entire high voltage was blocked by the high-side device, the voltage across the high-side device never exceeds 700V, which is 1.35 times the circuit high voltage. When the current switched through the high-side device is less than 30 Amps, for example between 20 and 30 Amps, the voltage across the high-side device never exceeds 630V, which is about 1.21 times the circuit high voltage. When the low-side device is switched from an on-state in which it conducted 50 Amps or less, for example between 40 and 50 Amps, to an off state in which the entire high voltage is blocked by the low-side device, the voltage across the low-side device also never exceeds 700V, which is 1.35 times the circuit high voltage. When the current switched is less than 30 Amps, for example between 20 and 30 Amps, the voltage across the high-side device never exceeds 610V, which is about 1.17 times the circuit high voltage. The voltages in excess of the high voltage supply supported across the high-side and low-side transistors are lower than those that could be achieved with conventional power converters.

A number of implementations have been described. Nevertheless, it will be understood that various modifications may be made without departing from the spirit and scope of the techniques and devices described herein. Accordingly, other implementations are within the scope of the following claims.

What is claimed is:

1. An electronic module, comprising:
   a first substrate comprising a first metal layer on a first insulating layer, the first metal layer including a first portion and a second portion;
   a second substrate comprising a second insulating layer between a second metal layer and a third metal layer, the second substrate having a second surface and a third surface on an opposite side of the second substrate from the second surface, the second insulating layer having a smaller area than the first insulating layer;
   a first semiconductor device comprising a first transistor; and
   a second semiconductor device comprising a second transistor; wherein
   the second substrate is mounted over the first portion of the first metal layer without being over the second portion of the first metal layer, with the second surface of the second substrate directly contacting the first metal layer;
   the first semiconductor device is mounted on the third surface of the second substrate;
   the second semiconductor device is mounted on the second portion of the first metal layer; and
   a source of the first transistor and a drain of the second transistor are electrically connected to each other and to the third metal layer.

2. The electronic module of claim 1, wherein the first transistor or the second transistor is a III-Nitride transistor.

3. The electronic module of claim 1, the first metal layer further including a third portion, wherein the third portion is electrically isolated from the second portion by a trench formed through the first metal layer between the third portion and the second portion.

4. The electronic module of claim 3, further comprising a capacitor, wherein a first terminal of the capacitor is electrically connected to the third portion of the first metal layer, a second terminal of the capacitor is electrically connected to the second portion of the first metal layer, and the capacitor extends over the trench.

5. The electronic module of claim 3, wherein a drain of the first transistor is electrically connected to the third portion of the first metal layer.

6. The electronic module of claim 3, wherein the first semiconductor device further comprises a third transistor, and a source of the third transistor is electrically connected to a drain of the first transistor.

7. An electronic module, comprising:
a first substrate comprising a first metal layer on a first insulating layer, the first metal layer including a first portion and a second portion;
a second substrate comprising a second insulating layer between a second metal layer and a third metal layer, the second substrate having a second surface and a third surface on an opposite side of the second substrate from the second surface, the second insulating layer having a smaller area than the first insulating layer;
a first semiconductor device; and
a second semiconductor device; wherein
the second semiconductor device is a transistor comprising a source electrode, a gate electrode, and a drain electrode;
the source electrode, the gate electrode, and the drain electrode are each on a first side of the first transistor;
the second substrate is mounted over the first portion of the first metal layer without being over the second portion of the first metal layer, with the second surface of the second substrate directly contacting the first metal layer;
the first semiconductor device is mounted on the third surface of the second substrate;
the second semiconductor device is mounted on the second portion of the first metal layer; and
the first semiconductor device comprises a second transistor, the transistor and the second transistor being part of a half bridge.

8. An electronic module, comprising:
a first substrate comprising a first metal layer on a first insulating layer, the first metal layer including a first portion and a second portion;
a second substrate comprising a second insulating layer between a second metal layer and a third metal layer, the second substrate having a second surface and a third surface on an opposite side of the second substrate from the second surface, the second insulating layer having a smaller area than the first insulating layer;
a third substrate comprising a third insulating layer between a fourth metal layer and a fifth metal layer, the third insulating layer having a smaller area than the second insulating layer;
a first semiconductor device comprising a second transistor; and
a second semiconductor device; wherein
the second semiconductor device is a transistor comprising a source electrode, a gate electrode, and a drain electrode;
the source electrode, the gate electrode, and the drain electrode are each on a first side of the transistor;
the second substrate is mounted over the first portion of the first metal layer without being over the second portion of the first metal layer, with the second surface of the second substrate directly contacting the first metal layer;
the third substrate is mounted directly over the third surface of the second substrate;
the first semiconductor device is mounted on the third surface of the second substrate;
the second semiconductor device is mounted on the second portion of the first metal layer; and
a source of the second transistor and a drain of the transistor are both electrically connected to the third metal layer.

9. The electronic module of claim 8, the first metal layer further including a third portion, wherein the third portion is electrically isolated from the second portion by a trench formed through the first metal layer between the third portion and the second portion.

10. The electronic module of claim 9, further comprising a capacitor, wherein a first terminal of the capacitor is electrically connected to the third portion of the first metal layer, a second terminal of the capacitor is electrically connected to the second portion of the first metal layer, and the capacitor extends over the trench.

11. The electronic module of claim 9, wherein a drain of the second transistor is electrically connected to the third portion of the first metal layer.

12. The electronic module of claim 9, wherein the first semiconductor device further comprises a third transistor, a source of the third transistor is electrically connected to a drain of the transistor, and a drain of the third transistor is electrically connected to the third portion of the first metal layer.

13. The electronic module of claim 7, further comprising a third substrate comprising a third insulating layer between a fourth metal layer and a fifth metal layer, the third insulating layer having a smaller area than the second insulating layer, wherein the third substrate is mounted directly over the third surface of the second substrate.

14. The electronic module of claim 7, wherein the first substrate and the second substrate comprise direct bonded copper substrates.

15. A method of manufacturing an electronic module, comprising:
providing a first substrate comprising a first metal layer on a first insulating layer, the first substrate having a first surface, the first substrate including a first portion and a second portion;
providing a second substrate comprising a second insulating layer between a second metal layer and a third metal layer, the second substrate having a second surface and a third surface on an opposite side of the second substrate from the second surface;
mounting the second substrate over the first surface in the first portion of the first substrate with the second surface between the third surface and the first surface;
mounting a first semiconductor device on the third surface of the second substrate; and
mounting a second semiconductor device on the first surface of the first substrate in the second portion of the first substrate; wherein
the second semiconductor device is a transistor comprising a source electrode, a gate electrode, and a drain electrode; and
the source electrode, the gate electrode, and the drain electrode are each on a first side of the transistor.

16. The method of claim 15, wherein the transistor is a III-Nitride transistor.

17. The method of claim 15, wherein the first semiconductor device or the second semiconductor device is a switching transistor which is configured to be hard-switched.

18. The method of claim 17, wherein a switching time of the switching transistor is about 3 nanoseconds or less.

19. The method of claim 15, wherein mounting the first semiconductor device on the second substrate or mounting the second semiconductor device on the first substrate is performed prior to mounting the second substrate over the first surface in the first portion of the first substrate.

20. The method of claim 15, wherein the second surface of the second substrate is attached directly to the first surface of the first substrate in the first portion of the first substrate.

21. The method of claim 15, wherein the first surface of the first substrate comprises a surface of the first metal layer, the second surface of the second substrate comprises a surface of the second metal layer, and the third surface of the second substrate comprises a surface of the third metal layer.

22. The method of claim 15, further comprising partially removing the first metal layer.

23. The method of claim 22, wherein partially removing the first metal layer comprises forming an isolation trench through the first metal layer.

24. The method of claim 22, wherein the partially removing of the first metal layer is performed prior to mounting the second substrate over the first surface in the first portion of the first substrate.

25. The method of claim 15, wherein mounting the second substrate over the first surface in the first portion of the first substrate comprises soldering the second surface of the second substrate to the first portion of the first surface of the first substrate.

26. The method of claim 15, wherein the first insulator layer or the second insulator layer comprises a ceramic material.

27. The method of claim 15, wherein one or more of the first, second, or third metal layers comprises copper.

28. The method of claim 15, wherein the first substrate or the second substrate is a direct bonded copper (DBC) substrate.

29. The method of claim 15, wherein an area of the first surface of the first substrate is larger than an area of the second surface of the second substrate.

30. The method of claim 15, wherein the first semiconductor device is part of a half bridge.

31. The method of claim 15, wherein the electronic module is part of a power inverter or a power converter.

32. The method of claim 15, further comprising mounting a capacitor having a first terminal and a second terminal on the electronic module.

33. The method of claim 32, further comprising forming a trench through the first metal layer in the second portion of the first substrate, and wherein mounting the capacitor on the electronic module comprises connecting the first terminal to the first metal layer on a first side of the trench and connecting the second terminal to the first metal layer on a second side of the trench.

34. The method of claim 15, wherein the first substrate further comprises a fourth metal layer on an opposite side of the first insulating layer from the first metal layer.

35. An electronic module, comprising:
a first substrate comprising a first metal layer on a first insulating layer, the first metal layer including a first portion, a second portion, and a third portion, wherein the third portion is electrically isolated from the first and second portions by a trench formed through the first metal layer between the third portion and the second portion;
a second substrate comprising a second metal layer on a second insulating layer, the second substrate having a second surface and a third surface on an opposite side of the second substrate from the second surface, the second insulating layer having a smaller area than the first insulating layer;
a semiconductor device comprising a transistor having a source electrode, a gate electrode, and a drain electrode; and
a capacitor having a first terminal and a second terminal; wherein
the second substrate is mounted over the first portion of the first metal layer without being over the second portion of the first metal layer, with the second surface of the second substrate directly contacting the first metal layer;
the semiconductor device is mounted on the third surface of the second substrate; and
the drain electrode of the transistor is connected to the third portion of the first metal layer, the first terminal of the capacitor is connected to the third portion of the first metal layer, and the second terminal of the capacitor is connected to the second portion of the first metal layer.

36. The electronic module of claim 35, wherein the transistor is a depletion-mode transistor and the semiconductor device further includes an enhancement-mode transistor.

37. The electronic module of claim 36, wherein the depletion-mode transistor is a III-Nitride transistor.

38. The electronic module of claim 36, wherein the depletion-mode transistor is a lateral device and the enhancement-mode transistor is a vertical device.

39. The electronic module of claim 38, wherein:
the enhancement-mode transistor comprises a second source electrode, a second gate electrode, and a second drain electrode; and
the enhancement-mode transistor is mounted directly on top of or over the source electrode of the depletion-mode transistor, with the first drain electrode in electrical contact with the source electrode of the depletion-mode transistor.

40. The electronic module of claim 39, wherein the gate electrode of the depletion-mode transistor is electrically connected to the second source electrode.

41. The electronic module of claim 35, wherein the first substrate and the second substrate are direct bonded copper (DBC) substrates.

* * * * *